United States Patent
Verschueren et al.

(10) Patent No.: US 12,057,286 B2
(45) Date of Patent: Aug. 6, 2024

(54) SYSTEMS AND METHODS OF CLAMP COMPENSATION

(71) Applicant: FEI Company, Hillsboro, OR (US)

(72) Inventors: Edwin Verschueren, Mierlo (NL); Paul Tacx, Roermond (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 18/084,430

(22) Filed: Dec. 19, 2022

(65) Prior Publication Data

US 2023/0120177 A1    Apr. 20, 2023

Related U.S. Application Data

(62) Division of application No. 16/685,897, filed on Nov. 15, 2019, now Pat. No. 11,562,877.

(51) Int. Cl.
  *H01J 37/02* (2006.01)
  *H01J 37/28* (2006.01)

(52) U.S. Cl.
  CPC ............ *H01J 37/023* (2013.01); *H01J 37/28* (2013.01); *H01J 2237/20221* (2013.01);
  (Continued)

(58) Field of Classification Search
  None
  See application file for complete search history.

(56) References Cited

U.S. PATENT DOCUMENTS 6,977,461 B2   12/2005   Hendricks et al.
7,791,043 B2   9/2010    Seya et al.
(Continued)

FOREIGN PATENT DOCUMENTS

CN   103346692 B   10/2013
CN   106707760 A   5/2017
(Continued)

OTHER PUBLICATIONS

Croft et al., "Creep, Hysteresis, and Vibration Compensation for Piezoactuators: Atomic Force Microscopy Application," Proceedings of the American Control Conference 3: 2123-2128, Jun. 2000 (6 pages).
Examination Report for European Application No. EP 20206830.0, issued by the European Patent Office on Sep. 7, 2021 (15 pages).
Extended European Search Report dated Mar. 2, 2021, issued by the European Patent Office in EP Application No. 20206832, (8 pages).
(Continued)

*Primary Examiner* — Andrew Smyth
(74) *Attorney, Agent, or Firm* — Klarquist Sparkman, LLP

(57) ABSTRACT

A method of producing a compensation signal to compensate for misalignment of a drive unit clamp element can include applying a clamp element drive signal to a drive unit clamp element to engage a mover element, determining a first displacement of the mover element, and determining a first compensation signal based at least in part on the first displacement. The method can further comprise applying the first compensation signal to the drive unit shear elements and the clamp element drive signal to the drive unit clamp element and determining a second displacement of the mover element. If the second displacement is less than a preselected threshold, the first compensation signal can be combined with an initial shear element drive signal to produce a modified shear element drive signal. If the second displacement is greater than the preselected threshold, a second compensation signal can be determined.

20 Claims, 23 Drawing Sheets

(52) U.S. Cl.
CPC ............... *H01J 2237/20264* (2013.01); *H01J 2237/20278* (2013.01); *H01J 2237/2802* (2013.01)

(56) References Cited

U.S. PATENT DOCUMENTS

| | | |
|---|---|---|
| 2001/0011707 A1 | 8/2001 | Visscher |
| 2002/0021428 A1 | 2/2002 | Nakano et al. |
| 2005/0151446 A1* | 7/2005 | Marie Hendriks . G03F 7/70758 310/328 |
| 2008/0023644 A1 | 1/2008 | Pedroni |
| 2008/0211349 A1 | 9/2008 | Seya et al. |
| 2008/0277582 A1 | 11/2008 | Shi et al. |
| 2009/0236540 A1 | 9/2009 | Seya et al. |
| 2013/0146766 A1 | 6/2013 | Ohshima et al. |
| 2016/0133437 A1 | 5/2016 | Moers et al. |
| 2016/0221197 A1 | 8/2016 | Claffee et al. |
| 2017/0125209 A1 | 5/2017 | Boeij et al. |
| 2019/0311877 A1 | 10/2019 | Willis et al. |

FOREIGN PATENT DOCUMENTS

| | | |
|---|---|---|
| CN | 107544241 A | 1/2018 |
| EP | 0457317 A1 | 5/1991 |
| EP | 0457317 B1 | 5/1991 |
| EP | 2973981 A2 | 9/2014 |
| EP | 2973981 A2 * | 1/2016 ......... G03F 7/70825 |
| EP | 2973981 B1 | 5/2018 |
| JP | S59184442 A | 10/1984 |
| JP | H06207891 A | 7/1994 |
| WO | WO 2018/024416 A1 | 2/2018 |

OTHER PUBLICATIONS

Kang et al., Development of compact high precision linear piezo-electric stepping positioner with nanometer accuracy and large travel range, Review of Scientific Instruments, AIP, Melvill, NY, vol. 78, No. 7, Jul. 18, 2007 (8 pages).

Liu and Zhou, "KP Model for Hysteresis of Piezoelectric Ceramic Actuators," Chinese Automation Congress (CAC), IEEE: 253-257, Nov. 2015 (5 pages).

Merry et al., "Using a Walking Piezo Actuator to Drive and Control a High-Precision Stage," *IEEE/ASME Transactions on Mechatronics*, 14(1): 21-31, 2009, (11 pages).

Micky Rakotondrabe; "Classical Prandtl-Ishlinskii Modeling and Inverse Multiplicative Structure to Compensate Hysteresis in Piezoactuators"; FEMTO-st Institute, UMR CNRS-6174 / UFC / ENSMM / UTBM; Automatic Control and Micro-Mechatronic Systems department (AS2M department); 25000 Besançon—France; (6 pages).

Yang et al., "Design and control of a multi-DOF micromanipulator dedicated to multiscale micromanipulation," Smart Mater Struct. 26: 115016, 2017 (25 pages).

* cited by examiner

SYSTEMS AND METHODS OF CLAMP COMPENSATION

CROSS REFERENCE TO RELATED APPLICATION

This patent application is a divisional of U.S. patent application Ser. No. 16/685,897, entitled SYSTEMS AND METHODS OF CLAMP COMPENSATION, filed on Nov. 15, 2019, which application is hereby incorporated by reference herein in its entirety.

FIELD

This disclosure pertains to systems and methods for operating positioning systems comprising clamp elements, such as piezoelectric elements.

BACKGROUND

High resolution imaging and/or device processing can be accomplished with one or more instruments such as a scanning electron microscope (SEM), a transmission electron microscope (TEM), an ion column, a laser, and/or other beam-generating instruments. Such instruments can require precisely positioning a workpiece to capture an image or process a desired area. Generally, positioning systems include a carrier element to which the workpiece (or specimen to be imaged) can be mounted and a set of actuators, such as motors, arranged to move the carrier element.

Some existing positioning systems are actuated using piezoelectric motors or actuators, for example, walking piezo actuators. However, piezo actuators can have a limited stroke, which may result in choppy movement. Disturbances of the workpiece should be minimized in order to achieve high-quality images and precise processing. However, existing positioning systems suffer from significant disturbances in position and velocity that can interfere with accurate positioning. Accordingly, there is a need for improved systems for positioning workpieces.

SUMMARY

Described herein are embodiments of drive units for positioning systems, as well as systems and methods for improving the movement of such devices. In a representative embodiment, a method can comprise applying a clamp element drive signal to a drive unit clamp element such that the clamp element moves in a first direction toward a mover element, and applying a shear element drive signal to a drive unit shear element such that the shear element moves in a second direction to compensate at least in part for misalignment between the drive unit clamp element and the mover element.

In any or all of the disclosed embodiments, the shear element drive signal can compensate at least in part for motion of the mover element due to an angle at which the drive unit clamp element contacts the mover element.

In any or all of the disclosed embodiments, the shear element drive signal can be based at least in part on a displacement of the mover element caused by contact of the drive unit clamp element and the mover element.

In any or all of the disclosed embodiments, the drive unit clamp element and the drive unit shear element can be piezo elements.

In any or all of the disclosed embodiments, applying the shear element drive signal can comprise applying an initial shear element drive signal and a compensation signal.

In any or all of the disclosed embodiments, the method can further comprise determining the modified shear element drive signal at least in part by determining a first displacement of the mover element in response to contact with the drive unit clamp element, and determining a first compensation signal at least in part based on a product of the first displacement of the mover element and an inverse shear constant of the drive unit shear element.

In any or all of the disclosed embodiments, determining the modified shear element drive signal can further comprise determining a second displacement of the mover element in response to application of the first compensation signal and determining a second compensation signal based at least in part on the second displacement of the mover element.

In any or all of the disclosed embodiments, the method can further comprise combining the second compensation signal with an initial shear element drive signal to obtain the modified shear element drive signal.

In any or all of the disclosed embodiments, the shear element drive signal can compensate at least in part for misalignment of the drive unit clamp element by causing movement of the drive unit shear element in a direction opposite the direction of movement of the mover element caused by contact with the drive unit clamp element.

In another representative embodiment, a method can comprise applying a clamp element drive signal to a drive unit clamp element to engage a mover element, determining a first displacement of the mover element, and determining a first compensation signal to be applied to one or more drive unit shear elements based at least in part on the first displacement. The method can further comprise applying the first compensation signal to the one or more drive unit shear elements and the clamp element drive signal to the drive unit clamp element, determining a second displacement of the mover element in response to the first compensation signal and the clamp element drive signal, and comparing the second displacement to a preselected threshold. For a second displacement less than the preselected threshold, the method can include combining the first compensation signal with an initial shear element drive signal to produce a modified shear element drive signal, and for a second displacement greater than the preselected threshold, the method can include determining a second compensation signal to be applied to the one or more drive unit shear elements.

In any or all of the disclosed embodiments, the method can further comprise applying the clamp element drive signal to the drive unit clamp element while applying the modified shear element drive signal to the one or more drive unit shear elements.

In any or all of the disclosed embodiments, determining the compensation signal can comprise multiplying the displacement of the mover element by an inverse shear constant of the one or more shear elements.

In any or all of the disclosed embodiments, the method can further comprise applying the first compensation signal and the second compensation signal to the one or more drive unit shear elements and the clamp element drive signal to the drive unit clamp element, determining a third displacement of the mover element, and comparing the third displacement to the preselected threshold. For a third displacement less than the preselected threshold, the method can include combining the second compensation signal with an initial shear element drive signal to produce a modified shear element drive signal, and for a third displacement greater than the preselected threshold, the method can include determining a third compensation signal to be applied to the one or more drive unit shear elements.

In any or all of the disclosed embodiments, the compensation signal is a first compensation signal, and determining the second compensation signal can comprise multiplying the second displacement of the mover element by an inverse shear constant of the one or more shear elements and subtracting the result from the first compensation signal.

In any or all of the disclosed embodiments, determining the displacement of the mover element comprises measuring the displacement of the mover element with a position encoder.

In any or all of the disclosed embodiments, displacement of the mover element is caused at least in part by misalignment between the drive unit clamp element and the mover element.

In a representative embodiment, a positioning system can comprise a control unit comprising a shear signal generator configured to generate a modified shear element drive signal, the modified shear element drive signal comprising an initial shear element drive signal and a compensation signal.

In any or all of the disclosed embodiments, the control unit further comprises a clamp signal generator configured to generate a clamp element drive signal.

In any or all of the disclosed embodiments, the positioning unit further comprises a drive unit comprising a clamp element and one or more shear elements and a mover element coupled to a carrier for holding a workpiece, the mover element being engaged with the drive unit and being movable relative to the drive unit.

In any or all of the disclosed embodiments, the control unit further comprises a processor configured to produce a compensation signal based at least in part on a displacement of the mover element.

The positioning systems described in any or all of the disclosed embodiments can be included in a system for electron microscopy. The system can comprise a scanning transmission electron microscope (STEM) and the positioning system, which can situated to selectively position a workpiece for imaging with the STEM.

In any or all of the disclosed embodiments, the STEM can be configured to image the workpiece while the workpiece is being moved by the positioning system.

In any or all of the disclosed embodiments, the control unit further can further comprise a lookup table (LUT) comprising a plurality of precalculated compensation signals.

The foregoing and other objects, features, and advantages of the disclosure will become more apparent from the following detailed description, which proceeds with reference to the accompanying figures.

DETAILED DESCRIPTION

Introduction

The present disclosure concerns systems and methods for moving carrier elements, such as wafer stage assemblies, along, for example, linear and/or curved guides or axes. The systems described herein can allow a workpiece such as a semiconductor wafer to be accurately positioned with respect to one or more tools (e.g., a scanning electron microscope (SEM), transmission electron microscope (TEM), ion column, laser beam, etc.) in a process chamber (e.g., a vacuum chamber) where, according to the needs of the system, the tools and/or the workpiece may be positioned at various angles. Although the following systems and methods are described in some examples with reference to semiconductor processing applications, the position systems and control methodologies described herein can also be applicable to other fields where precise positioning and/or imaging are used, such as the preparation and analysis of biological samples.

Example 1

Figure 1:
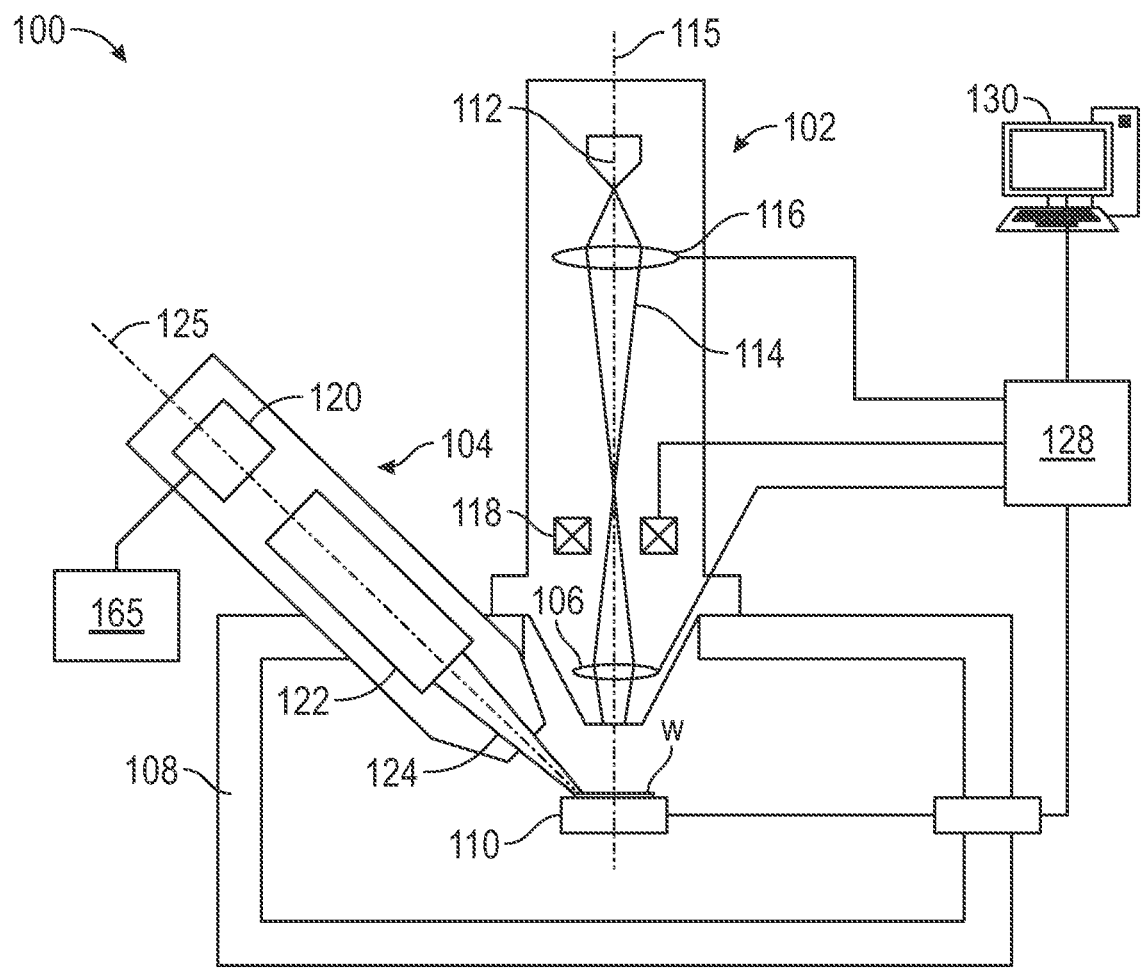
FIG. 1 illustrates a representative embodiment of a multi-beam system.

Referring to FIG. 1, in a representative embodiment, a multi-beam system can be configured as a dual-beam system 100 comprising a scanning electron microscope (SEM) generally indicated at 102 and an ion beam column generally indicated at 104. The SEM 102 can comprise one or more charged particle beam (CPB) lenses such as a condenser lens 116 and an objective lens 106. In some embodiments, one or more CPB lenses can be magnetic lenses, and particularly, the objective lens 106 can be a magnetic objective lens. The ion beam column is arranged to provide a focused ion beam (FIB) to a workpiece W, and the SEM 102 is situated for production of an image of the workpiece W.

The SEM 102 and the ion beam column 104 can be mounted to a vacuum chamber 108 housing a movable positioning system 110 for holding the workpiece W. The vacuum chamber 108 can be evacuated using vacuum pumps (not shown). As discussed in further detail below, the positioning system 110 can be movable along the X-, Y-, and/or Z-axes as shown with respect to a coordinate system 150, wherein the Y-axis is perpendicular to the plane of the page.

In some embodiments, the SEM 102 can be arranged vertically above the workpiece W and can be used to image the workpiece W, and the ion beam column 104 can be arranged at an angle and can be used to machine and/or process the workpiece W. FIG. 1 shows an exemplary orientation of the SEM 102 and the ion beam column 104.

The SEM 102 can comprise an electron source 112 and can be configured to manipulate a "raw" radiation beam from the electron source 112 and perform upon it operations such as focusing, aberration mitigation, cropping (using an aperture), filtering, etc. The SEM 102 can produce a beam 114 of input charged particles (e.g., an electron beam) that propagates along a particle-optical axis 115. The SEM 102 can generally comprise one or more lenses (e.g., CPB lenses) such as the condenser lens 116 and the objective lens 106 to focus the beam 114 onto the workpiece W. In some embodiments, the SEM 102 can be provided with a deflection unit 118 that can be configured to steer the beam 115. For example, the beam 114 can be steered in a scanning motion (e.g., a raster or vector scan) across a sample being investigated or a workpiece to be processed.

The dual-beam system 100 can further comprise a computer processing apparatus and/or a controller 128 for controlling, among other things, the deflection unit 118, charged particle beam (CPB) lenses 106, 116, and detectors (not shown), and for displaying information gathered from the detectors on a display unit. In some cases, a control computer 130 is provided to establish various excitations, record imaging data, and generally control operation of both the SEM and the FIB.

Referring still to FIG. 1, the ion beam column 104 can comprise an ion source (e.g., a plasma source 120) and ion beam optics 122. In the illustrated embodiment, the ion beam column 104 is a plasma focused ion beam (PFIB), however, in other embodiments, the ion beam column 104 can be a standard focused ion beam (FIB) having a liquid metal ion source (LMIS), or any other ion source compatible with a focused ion beam column. The ion beam column 104 can produce and/or direct the ion beam 124 along an ion-optical axis 125. As mentioned above, the ion column 104 can be used to perform imaging, processing and/or machining operations on the workpiece, such as incising, milling, etching, depositing, etc.

In embodiments wherein the ion beam is a PFIB, the ion source 120 can be fluidly coupled to a plurality of gases via a gas manifold 165 that includes gas sources coupled by respective valves to the ion source 120. During operation of the ion source 120, a gas can be introduced, where it becomes charged or ionized, thereby forming a plasma. Ions extracted from the plasma can then be accelerated through the ion beam column 104, becoming an ion beam. In other embodiments, the system 100 can comprise one or more lasers, or other types of milling or diagnostic tools.

As mentioned above, such multi-beam systems can comprise a positioning system (e.g., a stage) configured to hold and position the workpiece W. The positioning system can position/move a carrier element in multiple degrees of freedom, including linear movement (e.g., to choose a particular area for analysis on a workpiece) and/or angular or rotational movement (e.g., to achieve a selected angle of the workpiece relative to an instrument). The positioning system can include one or more piezo actuators in which the disclosed clamp compensation systems and methods can be used.

Additional details of the piezo motors, stages, and beam systems described herein can be found in the application entitled "Systems and Methods of Hysteresis Compensation" filed herewith, (now U.S. application Ser. No. 16/686, 011, issued as U.S. Pat. No. 11,538,652), and in the application entitled "Electron Microscope Stage," filed herewith, (now U.S. application Ser. No. 16/686,004, issued as U.S. Pat. No. 11,244,805), each of which is incorporated by reference herein in its entirety.

Example 2

Figure 2A:
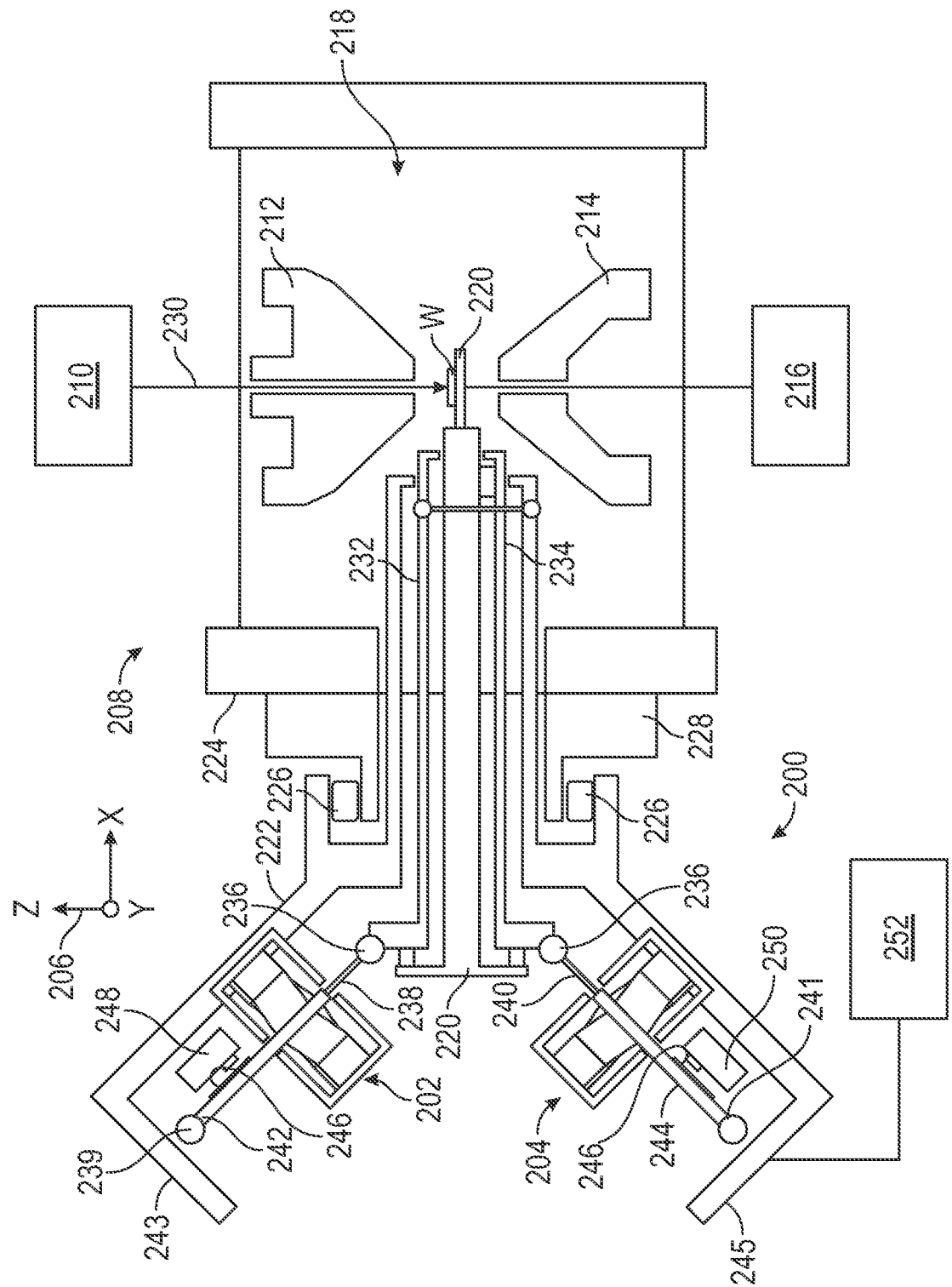
FIG. 2A illustrates a schematic cross-sectional side view of a representative embodiment of a positioning system mounted to the side of an electron microscope system.
Figure 2B:
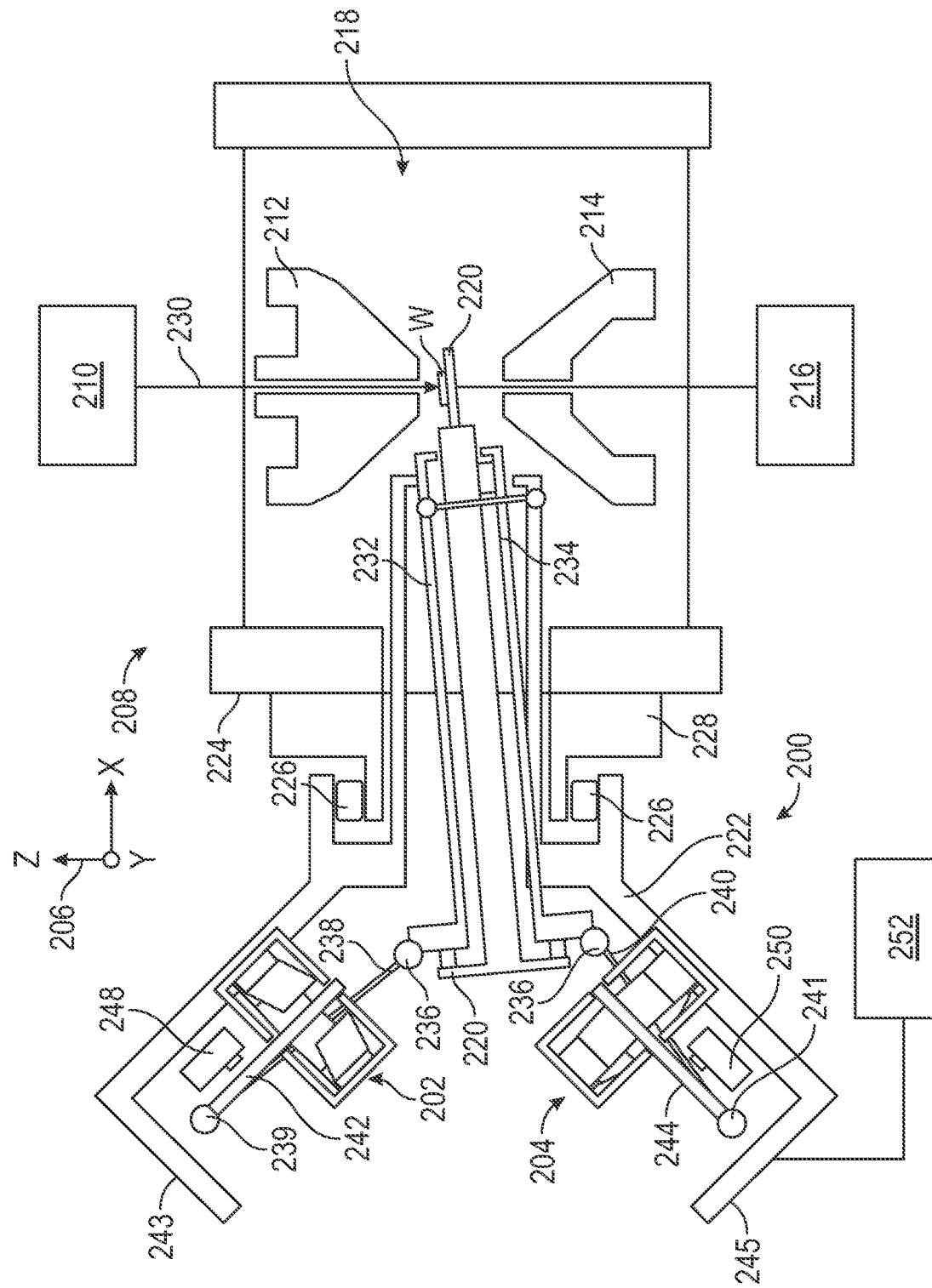
FIG. 2B illustrates the system of FIG. 2A with the workpiece displaced along the z-axis.

FIGS. 2A and 2B show cross-sectional views of an exemplary positioning system 200 coupled to a beam system configured as a charged particle microscope (CPM) generally indicated at 208. The positioning system 200 can comprise one or more drive units. For example, in the illustrated embodiment the system can comprise three drive units, of which two drive units 202 and 204 can be seen in FIG. 2. In the illustrated embodiment, the drive units 202, 204 are configured as walking or stepping piezo drive units, such as Heinmade Piezo Stepper (HMPS) actuators available from Heinmade BV. However, in other embodiments, the drive units can comprise other types of actuators, such as other types of piezo actuators, voice coil motors, rack and pinion systems, linear motors, etc.

The first and second drive units 202, 204 can be configured to position the workpiece W along at least the X- and Z-axes of the coordinate system 206 defined with respect to the beam system 208. As noted above, the positioning system can comprise three or more drive units, allowing for movement of the workpiece along the X-, Y-, and Z-axes. In some particular embodiments, the positioning system can comprise three drive units oriented such that each drive unit is offset from the others by 120 degrees.

As noted above, the positioning system 200 can be used with multi-beam systems, such as the CPM 208. The CPM 208 can be, for example, a scanning electron microscope (SEM), transmission electron microscope (TEM), or a combination scanning and transmission electron microscope (STEM). The CPM 208 can comprise a beam source 210, an upper pole objective lens 212, a lower pole objective lens 214, a detector 216 (e.g., a camera, a photomultiplier, photodiode, CMOS detector, CCD detector, photovoltaic cells, etc.). The components can be positioned at least partially within a vacuum chamber 218. A carrier element 220 including a workpiece W positioned thereon is shown extending from the positioning system 200 into the vacuum chamber 218.

Positioning system 200 can comprise a frame or housing 222 mounted on an external surface 224 of the CPM 208 (e.g., an external surface of the vacuum chamber 218). The housing 222 can be mounted to the surface 224 using one or more bearings 226, which allow the housing 222 to tilt or rotate (e.g., about the x-axis) relative to the surface 224. In some embodiments, as shown in FIG. 2, the bearings 226 can be coupled to a mounting element 228 disposed on the surface 224 of the CPM 208.

The housing 222 can be disposed such that a portion of the housing comprising the carrier element 220 for holding the workpiece W can extend through an opening in the side of the CPM 208 and at least partially into the vacuum chamber 218. The positioning system 200 can be configured to adjust the position of the workpiece W relative to the beam 230 by using the drive units (e.g., first and second drive units 202, 204) to adjust the position of the carrier element 220, as described in more detail below.

The carrier element 220 can be coupled to first and second guides 232, 234. Each guide 232, 234 can be further coupled, via respective joints 236 (e.g., a hinge, knuckle joint, ball joint, etc.) to a respective strut member 238, 240. The strut 238 can be pivotably coupled to a mover element or member 242 at a pivot joint 239, and the strut 240 can be pivotably coupled to a mover element or member 244 at a pivot joint 241. The first and second drive units 202, 204 can be configured to engage the mover elements 242 and 244, respectively. The drive unit 202 can be configured to move the mover element 242 along its axis toward and away from a rear wall 243 of the housing 222 in a series of step motions, as described in greater detail below. The drive unit 204 can be configured to move the mover element 244 along its axis toward and away from a rear wall 245 of the housing 222, similar to the mover element 242. The struts 238, 240 (along with the mover elements and the drive units) can be positioned at an angle relative to one another such that motion of the mover element 242 away from the rear wall 243, along with motion of the mover element 244 toward the rear wall 245 can cause the carrier element 220 to tilt out of the X-Y plane, as shown in FIG. 2B. Simultaneous movement of the mover elements 242 and 244 away the walls 243 and 245, and toward the CPM 208, can move the carrier element 200 along the X-axis. In the illustrated embodiment, the mover elements 242 and 244 are positioned at an angle of 90° relative to one another. In certain embodiments, three drive units and corresponding mover elements can be arrayed around the axis of the carrier element 220 with an angular spacing of 120°.

Each mover element 242, 244 can comprise a respective encoder scale 246. First and second position encoders 248 and 250 (e.g., optical encoders) mounted to the housing 222 can be configured to determine the position of each mover element 242, 244, respectively, based on the encoder scales 246. The encoder scales 246 can be coupled to or formed integrally with the movers 242, 244.

Figure 3:
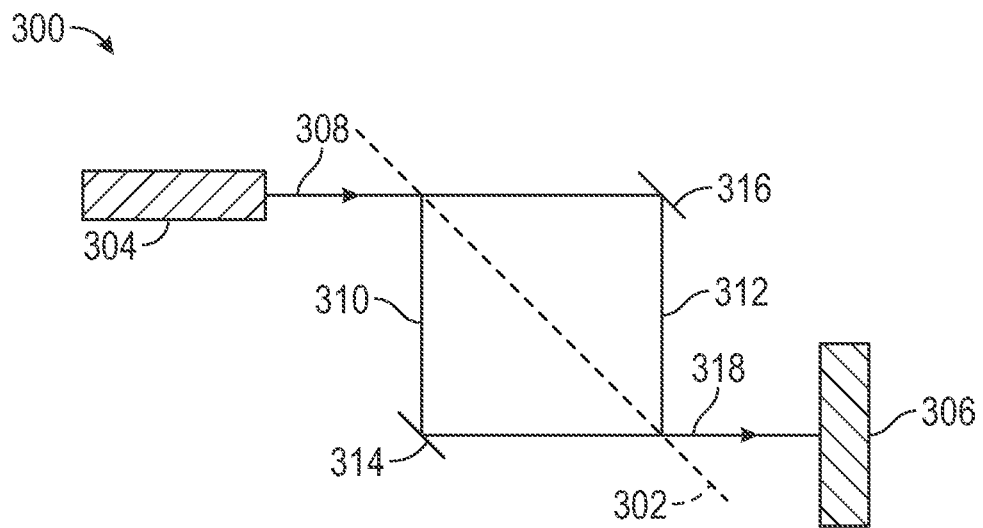
FIG. 3 illustrates a schematic representation of a position encoder, according to one embodiment.

FIG. 3 illustrates a schematic diagram of an exemplary position encoder 300. An encoder scale 302 is mounted to a mover, which can be positioned between a light source 304 and a detector 306. In certain embodiments, the light source and the detector can be mounted to the housing of the positioning system.

As shown, a beam 308 produced by the light source 304 is split into two beams 310, 312 when passing through the encoder scale 302. Two mirrors 314, 316 are used to reunite the beams and direct the united beam 318 into the detector 306.

Referring again to FIG. 2A, each encoder 248, 250 can be configured to determine the position of the respective mover element 242, 244. The location data generated by the encoders 248, 250 can be used by a controller 252 to operate the actuators 202, 204 to position the mover elements 242, 244 at a selected location, thereby positioning the workpiece W at a selected location, as described in more detail below. The positioning system can include one or more piezo actuators in which the disclosed clamp compensation systems and methods can be used.

Example 3

Figure 4A:
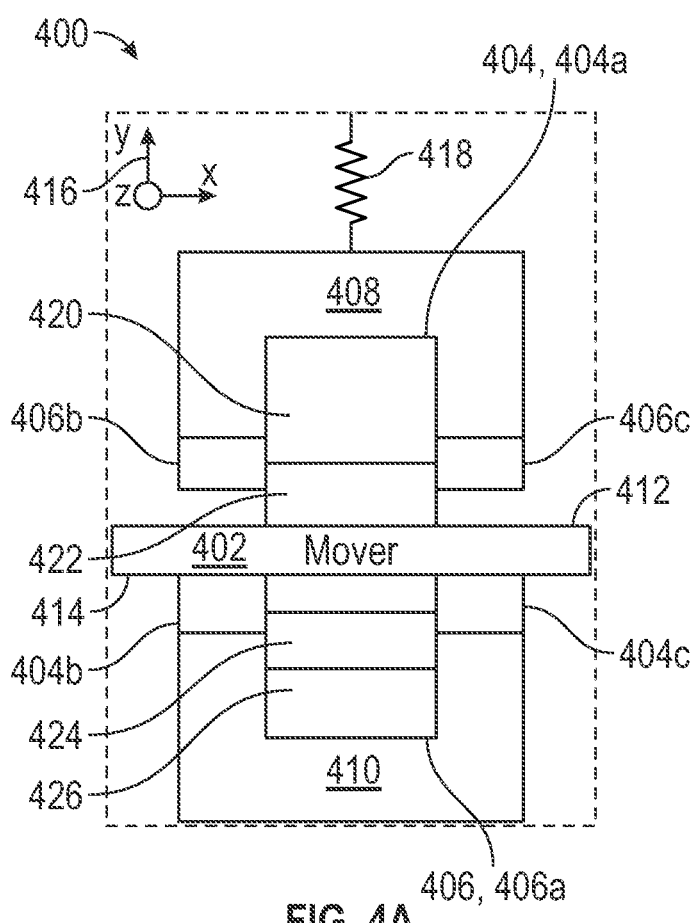
FIG. 4A is a schematic diagram illustrating a front view of a drive unit engaged with a mover element, according to one embodiment.
Figure 4B:
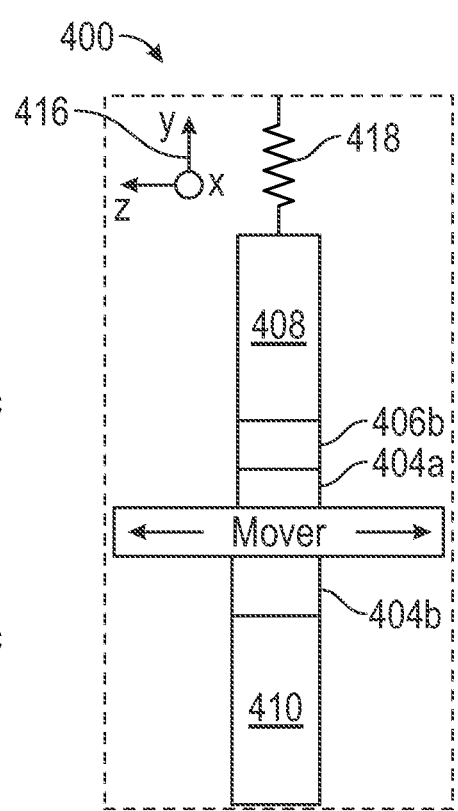
FIG. 4B is a schematic diagram illustrating a side view of the drive unit of FIG. 4B.

FIGS. 4A and 4B illustrate an exemplary drive unit 400 in greater detail, which may be configured for use with the positioning system as either the drive unit 202 or 204. The drive unit 400 can engage a mover member or element 402. As described above, the mover element 402 can be coupled to the carrier element, and can therefore position the workpiece W relative to the CPM 208 or other instruments in the vacuum chamber 218. In the illustrated embodiment, the drive unit 400 can be a piezo drive unit comprising two sets of actuators 404, 406 housed within first and second frame or housing portions 408, 410.

For example, in the illustrated embodiment, each actuator set can comprise three movable members, referred to herein as actuators. Each actuator, in turn, can comprise one or more actuator elements, such as a shear element, a clamp element, or various combinations thereof. Each of the actuator elements can be independently movable and/or controllable. In other embodiments, the actuator sets can comprise a greater or fewer number of actuators. Additionally, although in the illustrated embodiments each set of actuators comprises an equal number of actuators, in other embodiments one set of actuators can comprise more or fewer actuators than the other. For example, the first set of actuators can comprise three actuators and the second set of actuators can comprise four actuators, etc.

Returning to FIG. 4A, the first set of actuators 404 can comprise a first actuator 404a disposed adjacent a first surface 412 of the mover element 402, and second and third actuators 404b, 404c disposed on the opposite side of the mover element 402 adjacent a second surface 414 of the mover element. In the illustrated embodiment, the first actuator 404a comprises a shear element 420 and a clamp element 422, and the second and third actuators 404b, 404c comprise shear elements. The clamp and/or shear elements can frictionally engage the mover element 402 in order to move the mover element 402 in a selected direction, as described in more detail below.

The second set of actuators 406 can comprise a first actuator 406a disposed adjacent the second surface 414 of the mover element 402, and second and third actuators 406b, 406c disposed adjacent the first surface 412 of the mover element 402. In the illustrated embodiment, the first actuator 406a comprises a shear element 424 and a clamp element 426, and the second and third actuators 406b, 406c comprise shear elements.

The two sets of actuators 404, 406 can be actuated in an alternating, stepping, or "walking" motion such that when the first set of actuators 404 engages with and exerts force on the mover element 402, the second set of elements 406 disengages or releases the mover element, and vice versa. There can be a brief period between steps when both sets of actuators 404 and 406 are in contact with the mover 402. This is referred to as a "takeover" condition, when one set of actuators "takes over" from the other set of actuators. This configuration, wherein one actuator of a set engages the first surface of the mover element and the second and third actuators of the set engage the second surface of the mover element helps mitigate distortion during operation, and can provide smoother motion of the mover element. The alternating takeover movement between the two sets of actuators advantageously minimizes slipping between the actuators and the mover element. In addition, this configuration allows for an extension of the stroke length of the drive unit without affecting the stiffness or motion performance.

When actuated, the shear elements can be displaced along the Z-axis, as shown with respect to coordinate system 416, wherein the Z-axis is perpendicular to the plane of the page in FIG. 4A and parallel to the plane of the page in FIG. 4B. The clamp elements can be displaced along the Y-axis. A large movement stroke can be achieved by alternating actuation of the sets of actuators.

In some embodiments, the first frame portion 408 can be coupled to a biasing member 418 (e.g., a spring) that allows the first frame portion 408 to move relative to the mover element 402. In use, when an actuator element is energized into an expanded position (e.g., clamp element 420 in FIG. 4A) the first frame portion 408 moves relative to the mover element 402, thereby compressing the biasing member 418. In some embodiments, the biasing member 418 can be biased into an expanded position in order to maintain frictional contact between the actuators housed in the first portion of the frame 408 and the mover element 402.

In some embodiments, the end portions (e.g., the portions adjacent the mover element) of the actuators can be coated with aluminum oxide to mitigate wear on the actuators and to extend the lifetime of the driving unit. In other embodiments, each of the clamp and/or shear elements can comprise a wear resistant plate configured to mitigate damage to the clamp and/or shear elements from frictional engagement with the mover.

Example 4

Figure 5A:
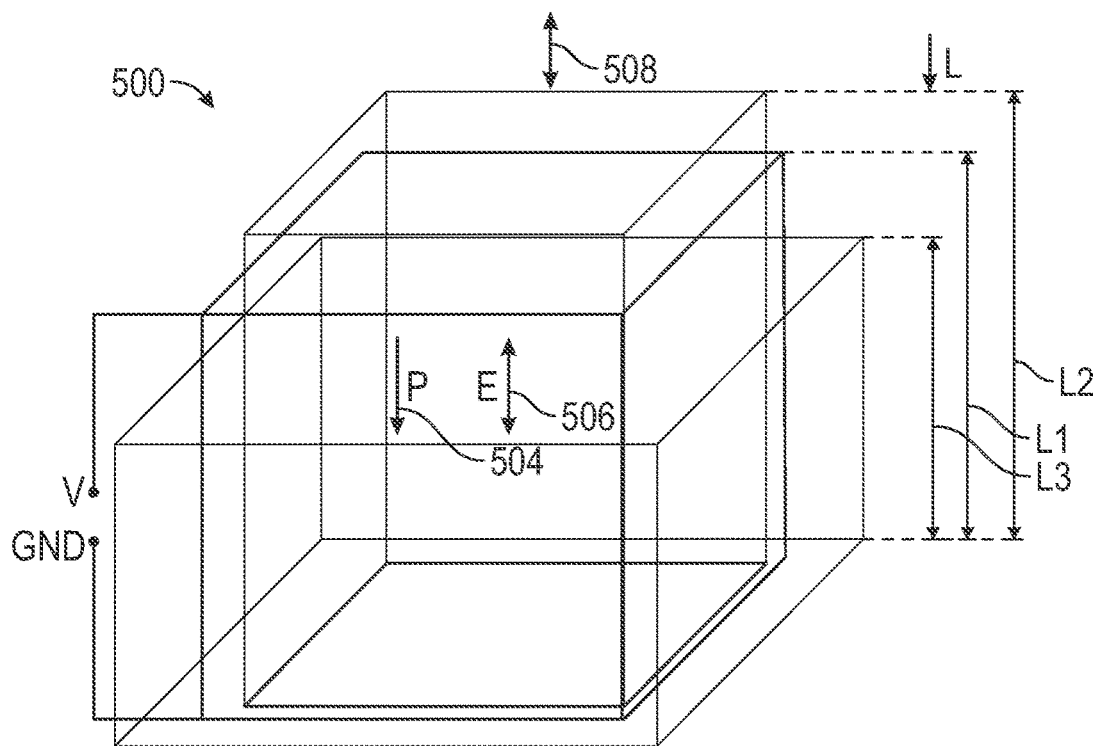
FIGS. 5A-5B are perspective views of a representative embodiment of a longitudinal piezo element.
Figure 5B:
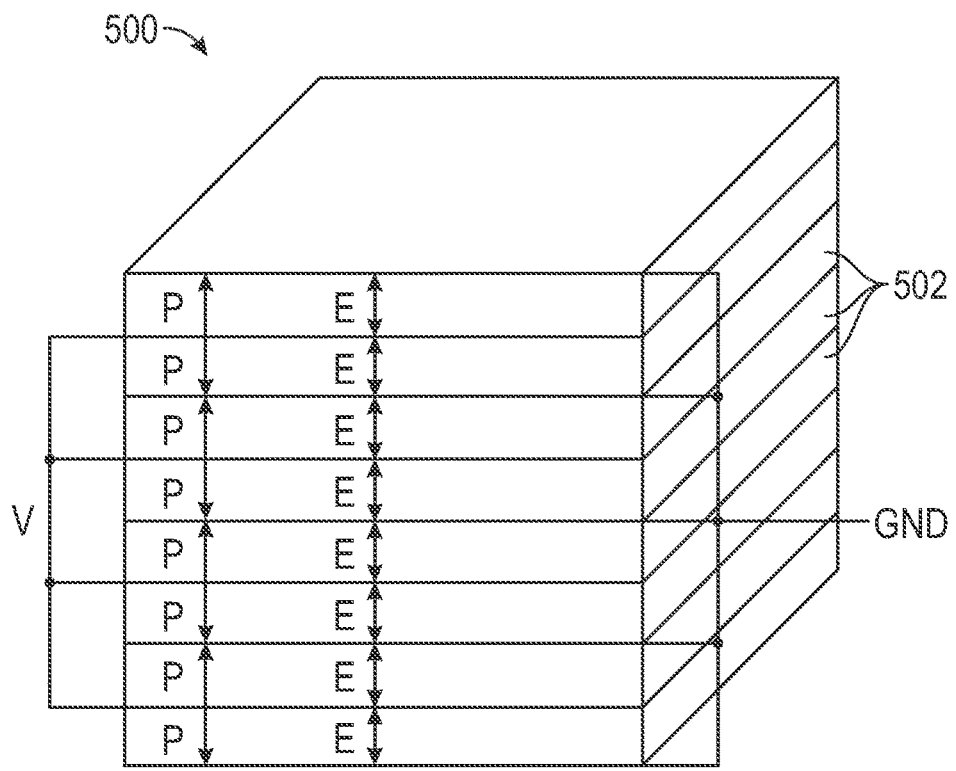
Figure 6A:
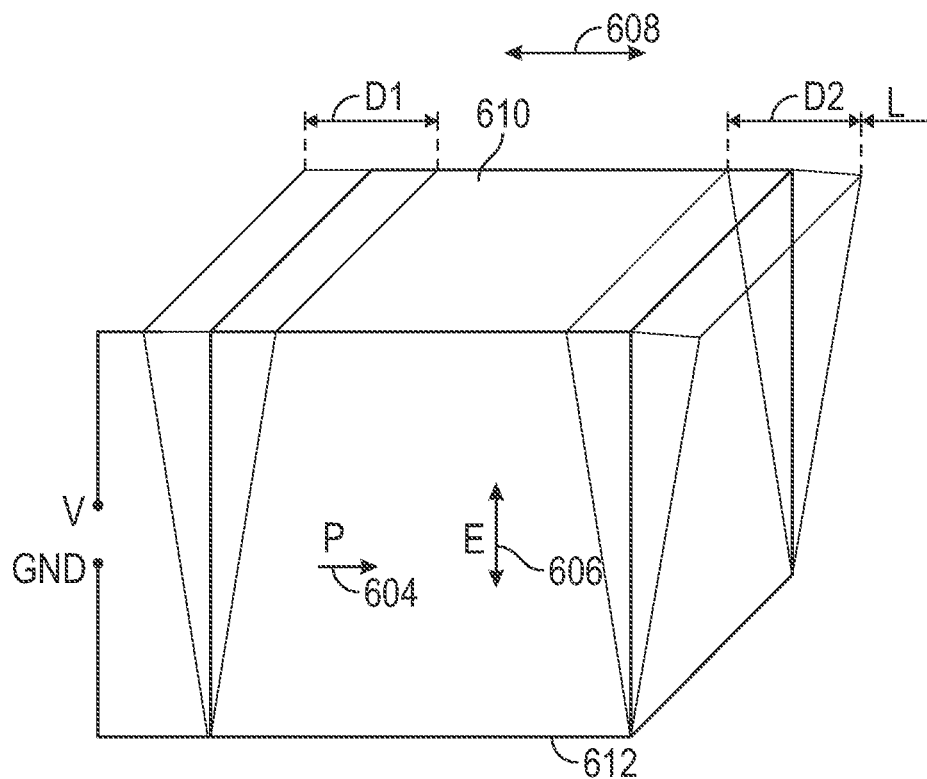
FIGS. 6A-6B are perspective views of a representative embodiment of a shear piezo element.
Figure 6B:
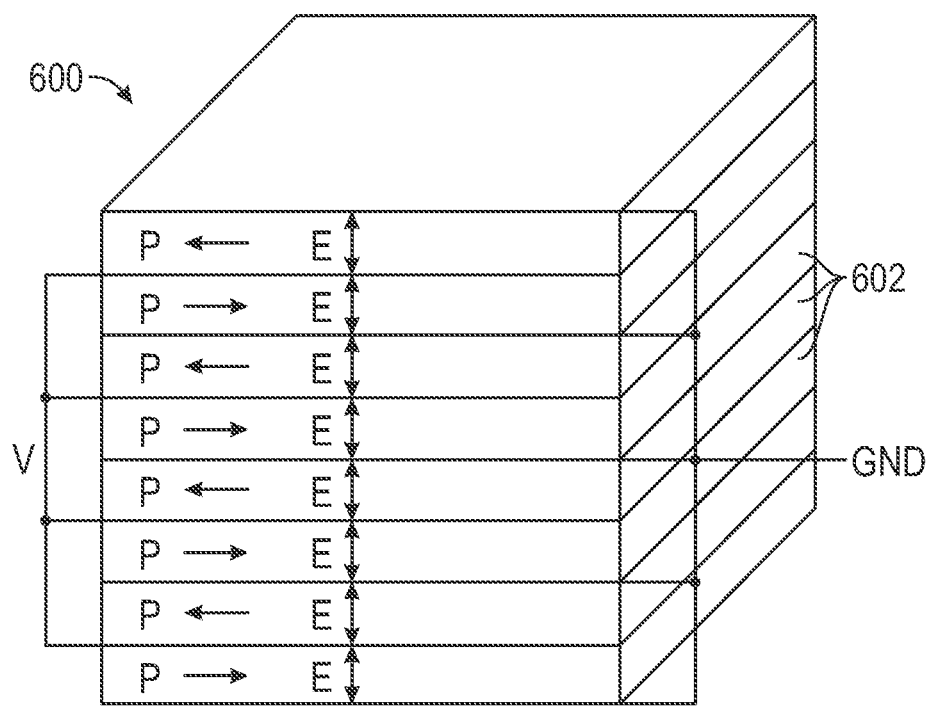

FIGS. 5A-5B show an exemplary embodiment of a clamp element 500, and FIGS. 6A-6B show an exemplary embodiment of a shear element 600. In the illustrated embodiments, the clamp elements and shear elements comprise piezoelectric elements.

In certain embodiments, the clamp element 500 can be a longitudinal piezo element and the shear element 600 can be shear piezo element. The longitudinal piezo element 500 can be configured to deform or elongate axially when a voltage is applied, and the shear piezo element 600 can be configured such that one end is laterally displaced with respect to the opposite end when a voltage is applied, as explained in detail below. As shown in FIGS. 5B and 6B, in some embodiments, each element 500, 600 can comprise a plurality of piezoelectric members 502, 602 disposed adjacent to one another. In other embodiments, the clamp and shear elements 500, 600 can be single layer piezo elements, or monolithic multi-layer piezo elements, also called monolithic co-fired piezo elements. In certain embodiments, the displacement of a clamp and/or shear element can be linearly related to the applied voltage. Depending on the way the piezo members 502, 602 are polarized, it can be considered a longitudinal element or a shear element. The clamp elements can move between a first, or neutral configuration, a second elongated configuration (e.g., when energized by applying a positive voltage), and/or a third shortened configuration (e.g., when energized by applying a negative voltage).

For example, as shown in FIG. 5A, the electrical field (shown by arrow 506) can be applied parallel to the direction of polarization (shown by arrow 504). In some embodiments, as shown in FIG. 5B, the clamp element can comprise eight piezo layers, however, in other embodiments, the clamp element can comprise a greater or fewer number of layers. In some particular embodiments, the clamp element can comprise three piezo layers. In some embodiments, the voltage applied to the clamp element can be, for example, between −30 V and 60 V.

When energized (e.g., by applying a positive or negative voltage), the clamp element 500 can expand and/or contract longitudinally, that is, in the direction shown by arrow 508. Referring to FIG. 5A, the clamp element 500 can have a first or neutral configuration having a first or natural length $L_1$ when no voltage is applied to the clamp element, a second or expanded configuration having a second length $L_2$ when a first or positive voltage is applied to the element, and a third or contracted configuration having a third length $L_3$ when a second or negative voltage is applied to the element. The second length $L_2$ can be greater than the first length $L_1$, which can be greater than the third length $L_3$. The length can be based at least in part on the magnitude of the applied voltage.

FIGS. 6A and 6B illustrate an exemplary shear piezo element 600. As shown in FIG. 6A, the electrical field (shown by arrow 606) is applied orthogonally to the direction of polarization (shown by arrow 604). In some embodiments, as shown in FIG. 6B, the shear element 600 can comprise eight layers of piezo members. However, in other embodiments, the shear element can comprise a greater or fewer number of layers. In some particular embodiments, the shear element 600 can comprise four layers of piezo members. In some embodiments, the voltage applied to the shear actuator can be, for example, between −250 V and 250 V.

When energized (e.g., by applying a positive or a negative voltage), a portion of the shear element 600 can shear or move laterally in a selected direction as shown by arrow 608. For example, the shearing motion causes displacement of a first surface 610 of the shear piezo element relative to a second surface 612 on the opposite side of the shear element. The shear element can have a first offset position wherein the first surface is displaced from the second surface in a first direction by a first displacement length $D_1$ when a positive voltage is applied, and a second offset position wherein the first surface is displaced from the second surface in a second direction (e.g., opposite the first direction) by a second displacement length $D_2$ when a negative voltage is applied. The displacement lengths $D_1$ and $D_2$ can be based at least in part on the magnitude of the applied voltage.

The piezoelectric members 502 and 602 can include but are not limited to ceramics (including naturally occurring and synthetic ceramics), crystals (including naturally occurring and synthetic crystals), group III-V and II-VI semiconductors, polymers, organic nanostructures, or any combinations thereof. In some particular embodiments, the piezoelectric elements can comprise lead zirconium titanate (PZT). Such piezoelectric elements can expand when a positive voltage is applied and contract when a negative voltage is applied. The magnitude and speed of contraction, expansion, and/or shear displacement can be dependent on the magnitude of the voltage applied to the piezo members.

Example 6

FIGS. 7A-7D show the positions of the actuators of an exemplary drive unit 700 (which can be configured similarly to the drive unit 400) throughout a drive cycle. The drive unit 700 is configured to engage a mover element 702. The drive unit 700 comprises two sets of actuators 704 and 706. Each actuator set can comprise three actuators. For example, the actuator set 704 can comprise actuators 704a, 704b, and 704c, and the actuator set 706 can comprise actuators 706a, 706b, and 706c. The actuators can comprise shear elements, clamp elements, and/or a combination thereof. For example, in the illustrated embodiment, actuators 704b, 704c, 706b, and 706c comprise shear elements. The actuator 704a can comprise a shear element 714 and a clamp element 716, and the actuator 706a can comprise a shear element 718 and a clamp element 720. The actuators can be housed in first and second frame portions 708, 710. In certain embodiments, the displacement of the actuators can be linearly related to the voltage applied. As there are two sets of actuators 704, 706 and each set can comprise two types of elements (clamp and shear), four drive signals can be used to move the sets of actuators 704, 706 in an alternating manner. In some embodiments, the drive signals can be configured as waveforms (e.g., voltage waveforms) due to the repetitive nature of the alternating or walking movement.

In this example, the actuators 704a and 706a have equal lengths, however, in other examples, the actuators 704a and 706a can have different lengths. In this example, there are two clamp elements 716 and 720 and six shear elements 704b, 704c, 714, 706b, 706c, 718. However, in other examples, a drive unit can comprise a greater or fewer number of clamp and shear elements.

Figure 7A:
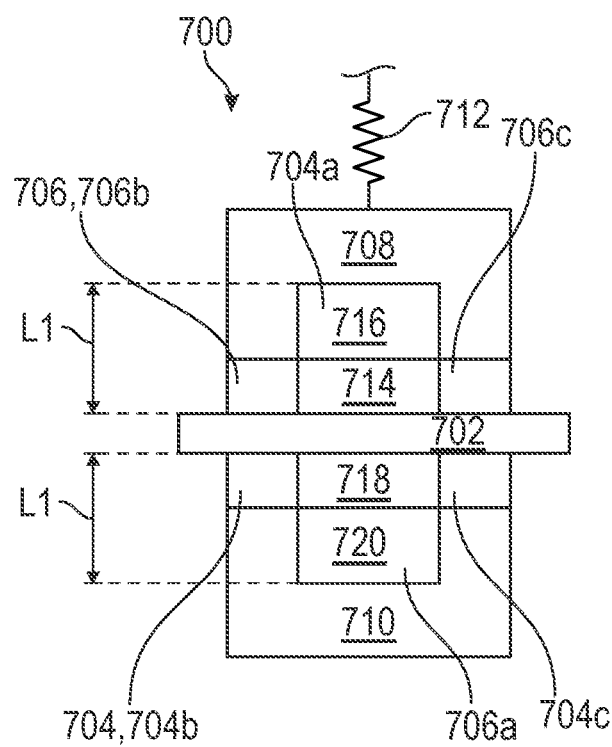
FIGS. 7A-7D illustrate an exemplary drive cycle of an embodiment of a drive unit engaged with a mover element.
Figure 7B:
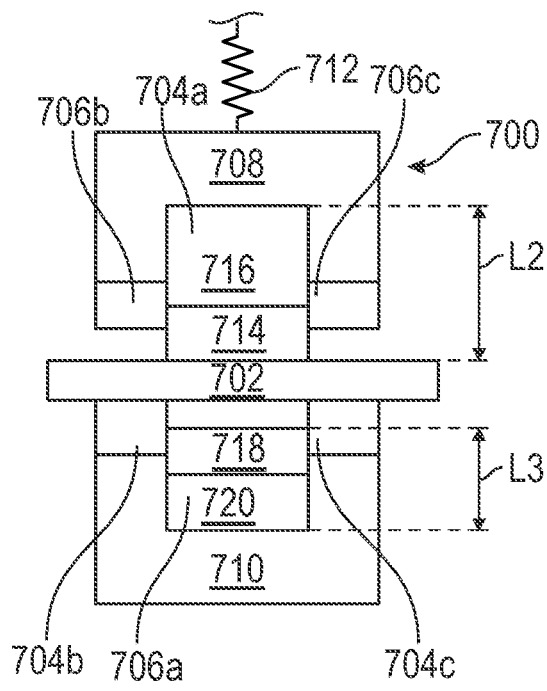
Figure 7C:
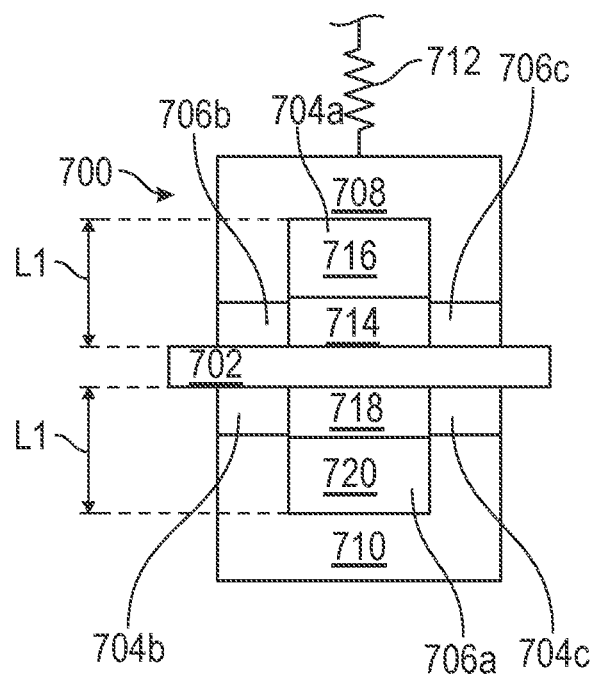
Figure 7D:
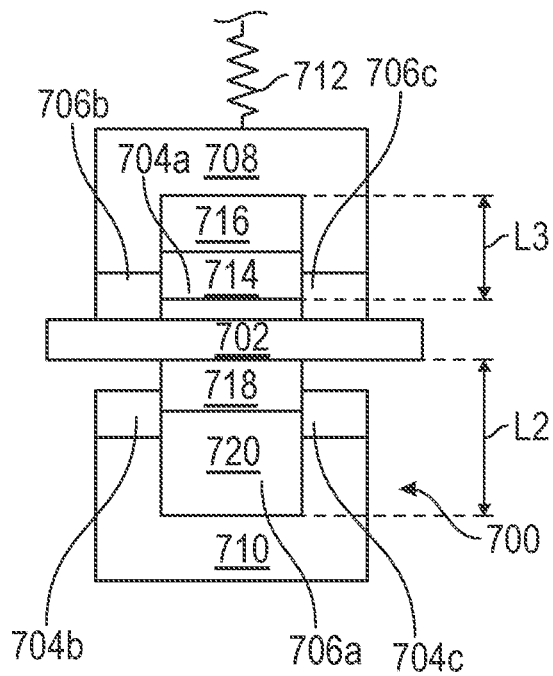
Figure 8A:
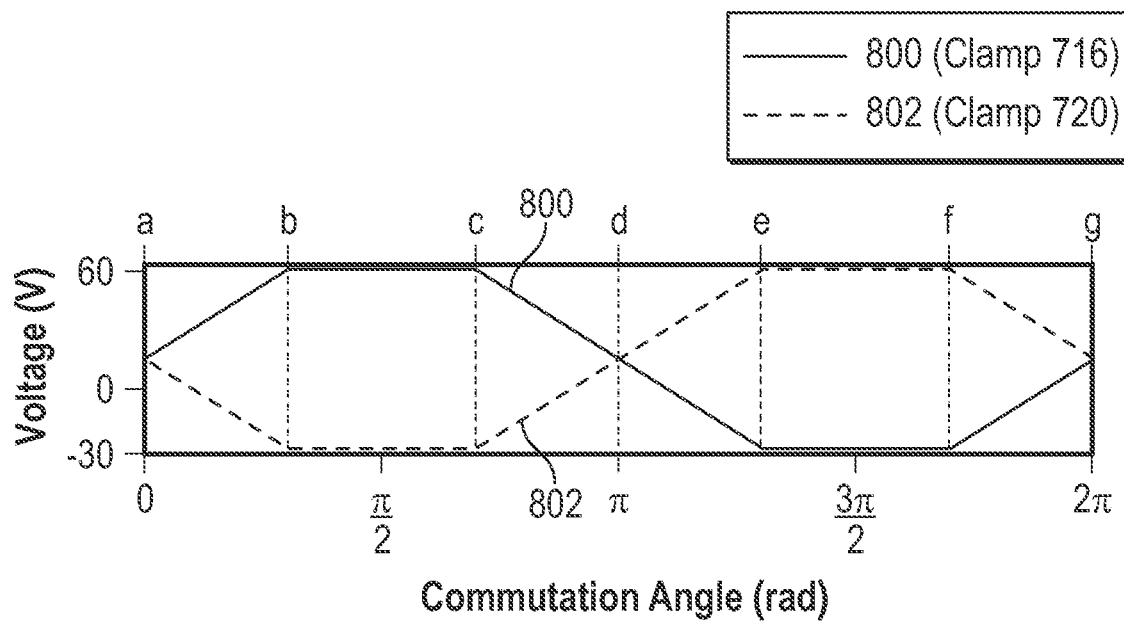
FIG. 8A is a graph of a representative drive signal for the clamp elements of the drive unit of FIGS. 7A-7D.
Figure 8B:
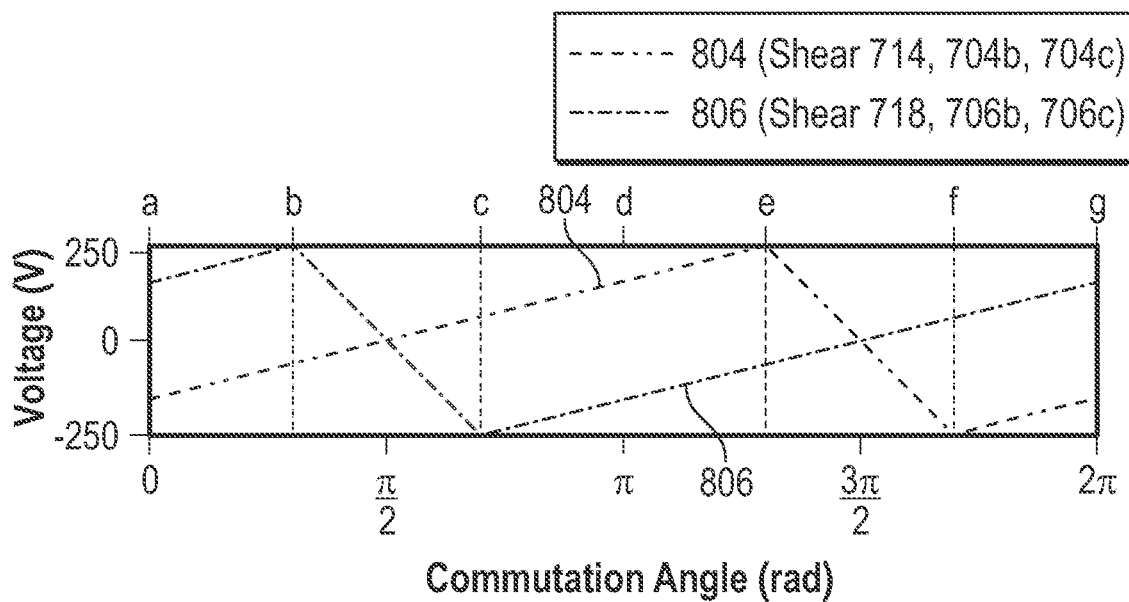
FIG. 8B is a graph of a representative drive signal for the shear elements of the drive unit of FIGS. 7A-7D.

FIGS. 8A and 8B illustrate the drive signals for the drive cycle shown in FIGS. 7A-7D. The drive signals can be dependent on the commutation angle α and can be periodic with a period of 2π. The commutation angle α can be defined using the following equation:

$$\alpha(t) = 2\pi \int_0^t f_\alpha(\tau) d\tau$$

where α(t) is the commutation angle over time, $f_\alpha(\tau)$ is the drive frequency of the drive signal as a function of time (τ).

FIG. 8A shows an exemplary driving or voltage signal for the clamp elements of the first and second sets of actuators, and FIG. 8B shows an exemplary driving or voltage signal for the shear elements of the first and second sets of actuators. Referring now to FIG. 8A, a first voltage signal 800 can be applied to the clamp element 716 of the first actuator set 704 and a second voltage signal 802 can be applied to the clamp element 720 of the second actuator set 706. The voltage signals in FIG. 8A ramp up and down at a constant rate between −30 V and 60 V. The drive signal of the clamp element 716 can be π rad out of phase with the drive signal of the clamp element 720 such that when the voltage applied to the clamp element 716 is 60 V, the voltage applied to the clamp element 720 is −30 V and vice versa. Both signals have the same period, maximum value, and minimum value. However, in other embodiments the drive signal of the clamp element 716 may be different from the drive signal of the clamp element 720.

The voltage signals in 804 and 806 FIG. 8B can increase or ramp up from −250 V to 250 V at a first rate through an angle of 3π/2 rad, and can decrease or ramp down from 250 V back to −250 V at a second rate over an angle of π/2 rad in the manner of a sawtooth wave. The signals in FIG. 8B can also be out of phase or phase-shifted by π rad.

FIG. 7A shows the drive unit 700 in a first or starting position in the drive cycle wherein the commutation angle is zero. This position corresponds with the drive signal values at a commutation angle of 0 rad in FIGS. 8A and 8B, indicated by reference letter a. As shown in FIG. 8A, the voltage applied to the clamp elements 716 and 720 of the actuators 704a and 706a is equal at 0 rad such that both actuators have an equal length $L_1$, and engage and clamp the mover element 702 between them. Referring to FIG. 8B, the voltage applied to the shear elements of the actuators 704b and 704c, and to the shear element 714 of the actuator 704a, can be −200 V. The voltage applied to the shear elements 706b and 706c, and to the shear element 720 of the actuator 706a, can be 200 V. Therefore, the actuators 704b, 704c, 706b, and 706c are also in contact with the mover element 702. The position of the actuators in FIG. 7A can correspond to the "takeover" movement wherein all elements of both sets of actuators 704, 706 are in equilibrium with each other, and in contact with the mover 702. The derivative with respect to the commutation angle of the shear-voltages of the shear elements in both shear groups can be equal. Accordingly, both shear groups can move with the same velocity.

FIG. 7B shows the drive unit in a second exemplary position in the drive cycle, corresponding to the portion of the drive signal shown by reference letters b-c in FIGS. 8A and 8B. The clamp element 716 of the actuator 704a of the first set of actuators 704 is energized with a maximum voltage, thus moving the actuator 704a from the first length $L_1$ to an expanded length $L_2$ that is greater than $L_1$. As shown in FIG. 8A, the voltage applied to clamp element 716 of actuator 704a can be 60 V and the voltage applied to the clamp element 720 of actuator 706a can be −30 V. The expanded length $L_2$ of the actuator 704a moves the first frame portion 708 relative to the mover element 702, such that the actuators 706b and 706c no longer engage the mover element 702. The first frame portion 708 can be coupled to a biasing element 712.

The biasing element 712 (e.g., a spring) can compress to allow movement of the first frame portion 708 relative to the mover element 702. The clamp element 720 of the actuator 706a meanwhile is energized with its minimum voltage (e.g., −30 V), thus moving the actuator 706a from the first length $L_1$ to a contracted configuration having length $L_3$, smaller than length $L_1$ such that the actuator 706a no longer engages the mover element 702. Actuators 706b and 706c are in position for the next "takeover" movement, while the actuators 704b, 704c, and 714 move, displace, or drive the mover element 702 with respect to the drive unit 700 under the influence of the increasing driving voltage in FIG. 8B. As shown in FIG. 8B, the voltage applied to shear elements 718, 706b, and 706c can drop from 250 V to −250 V and the voltage applied to shear elements 714, 704b, and 704c can rise from −250 V to 250 V.

FIG. 7C shows the actuator in a third exemplary position in the drive cycle, corresponding to the portion of the drive signals indicated by reference letter d in FIGS. 8A and 8B. The third exemplary position is a second "takeover" movement similar to the takeover movement described above with respect to FIG. 7A in which all of the actuators are in contact with the mover element 702. As shown in FIG. 8A, the voltage applied to the clamp elements 716 and 720 of the actuators 704a and 706a is equal at 0 rad such that both actuators have an equal length $L_1$, and engage and clamp the mover element 702 between them. Referring to FIG. 8B, the voltage applied to the shear elements of the actuators 704b and 704c, and to the shear element 714 of the actuator 704a, can be 200 V. The voltage applied to the shear actuators 706b and 706c, and to the shear element 718 of the actuator 706a, can be −200 V.

FIG. 7D shows the actuator in a fourth exemplary position in the drive cycle, corresponding to the portion of the drive signal shown by reference letters e-f in FIGS. 8A and 8B. This position is similar to the position shown in FIG. 7B, except that the second set of actuators 706 is engaged with the mover element 702 and the first set of actuators 704 are disengaged. The clamp element 720 of the actuator 706a is energized with a maximum voltage, thus moving actuator 706a from length $L_1$ to an expanded configuration having length $L_2$ greater than $L_1$. As shown in FIG. 8A, the voltage applied to clamp element 720 of actuator 706a can be 60 V and the voltage applied to clamp element 716 of actuator 704a can be −30 V. The expanded configuration of the actuator 706a can move the mover element 702 (and thereby the elements 704a, 706b, 706c and the first frame portion 708) relative to (e.g., away from) the second frame portion 710, such that actuators 704b and 704c no longer engage the mover element 702. The clamp element 716 is energized with its minimum voltage (e.g., −30 V), thus moving the actuator 704a from the first length $L_1$ to a contracted configuration having length $L_3$, smaller than length $L_1$ such that actuator 704a is not engaged with the mover element 702. Actuators 704b and 704c are in position for the next "takeover" movement, while actuators 706b and 706c drive or displace the mover element 702 due to the increasing driving voltage in FIG. 8B. As shown in FIG. 8B, the voltage applied to shear elements 718, 706b, and 706c can rise from −250 V to 250 V and the voltage applied to shear elements 714, 704b, and 704c can drop from 250 V to −250 V.

Because the selected drive signals of the actuator sets are periodic, the configuration of the drive unit corresponding to the portion of the drive signal shown by the reference letter g in FIGS. 8A and 8B is the same as the configuration shown in FIG. 7A. This combination of piezo elements and drive signals enables the drive unit to move the mover element 702 in a series of steps reminiscent of a walking motion. This drive cycle can be repeated as necessary in order to move the mover element 702 to a selected position. The direction of the drive signals can also be reversed in order to move the mover element in the opposite direction.

Example 7

As described previously, the drive unit(s) can be used to move the mover(s), thereby positioning the workpiece W relative to a charged particle microscope (CPM), for example, a STEM. Disturbances in the position and velocity of the workpiece W can be undesirable for tracking point to point movements of the workpiece W travelling at constant velocity. For example, disturbances can cause the guidance system to lose track of the positioning of the workpiece and/or a selected area of the workpiece that is meant to be imaged. In some embodiments, the CPM can be configured to image the workpiece W while the workpiece is in motion. In such embodiments, it is particularly advantageous to have smooth and consistent movement of the workpiece W.

Figure 9:
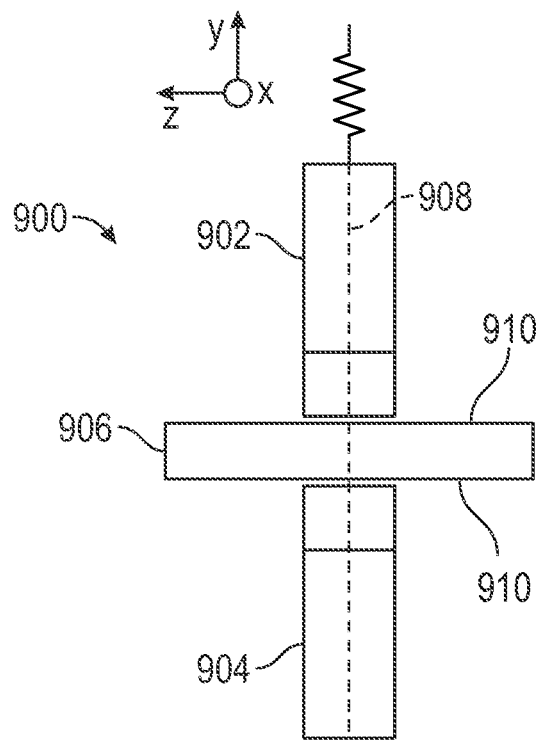
FIG. 9 illustrates a side elevation view of a representative embodiment of a drive unit engaged with a mover element in which the clamp surface of the clamp element is parallel to the surface of the mover element.

As shown in FIG. 9, actuators 902, 904 of a drive unit 900 are typically positioned such that they are perpendicular to the mover element 906. For example, the actuators 902, 904 can be positioned such that an axis 908 extending longitudinally through the actuators 902, 904 would form a 90° angle with the surface of the mover element 906. The surface of the actuators 902, 904 that contacts the contact surface 910 of the mover element is parallel to the mover element 906, and the actuators move perpendicularly relative to the surface of the mover. When in use, this configuration allows actuators that comprise a clamp element to engage the mover element without affecting the position of the mover element.

Example 8

Figure 10:
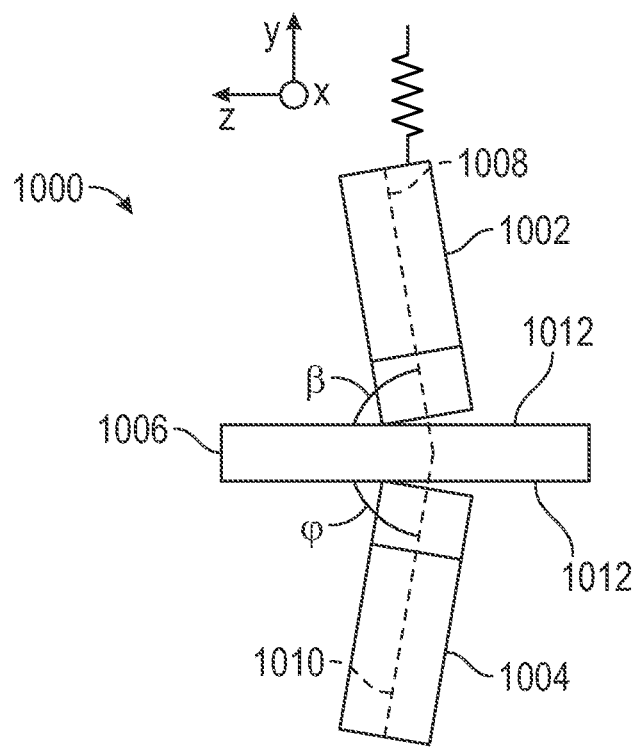
FIG. 10 illustrates a side elevation view of an embodiment of a drive unit engaged with a mover element in which clamp element surfaces are tilted with respect to to the surface of the mover element.

However, as shown in FIG. 10, in some embodiments one or both of the actuators 1002, 1004 of the drive unit 1000 can be positioned at an angle (e.g., at a tilt) relative to the mover element 1006. This can be referred to as 'misalignment of the clamp elements.' In such embodiments, the surface of the actuator that contacts the contact surface 1012 mover element is not parallel to the surface 1012 and the actuators move at a non-perpendicular angle with respect to the mover element. For example, practical limitations regarding tolerances in the dimensions and/or position of components within the system can result in one or both of the actuators 1002, 1004 being angled or tilted with respect to the mover element 1006. This is illustrated by lines 1008, 1010 extending axially through the actuators 1002 and 1004, respectively, and forming angles β, φ relative to a contact surface 1012 the mover element 1006. Tilted actuators 1002, 1004 can result in changes (e.g., additions or subtractions) in the velocity of the shear elements, thereby creating disturbances in the position and velocity of the workpiece W. For example, an angled actuator element may contact the surface of the mover before the commutation angle α at which a perpendicular actuator would be expected to make contact. This can push the mover forward or backward as the actuator continues to elongate, depending upon the direction of the misalignment.

Example 9

Figure 11:
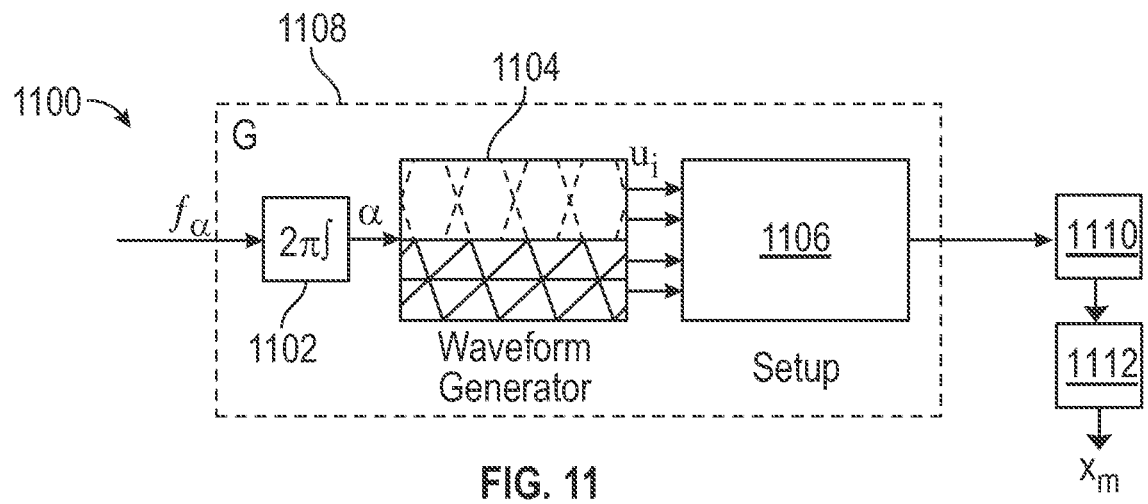
FIG. 11 is a schematic block diagram of a representative embodiment of an open-loop control system.

The disturbances caused by a tilted actuator can be quantified using, for example, an open-loop clamping measurement. Exemplary control architecture 1100 for such an open-loop measurement is shown in FIG. 11. The control system 1100 can comprise an integrator tool or module 1102 and a signal generator module 1104. The drive unit is represented at block 1106. The blocks 1102, 1104, and 1106 are grouped together inside a block 1108 representative of the physical system G (e.g., which can include a carrier unit, a drive unit, a position encoder, etc.). In the illustrated embodiment, a driving frequency $f_\alpha$ can be inputted to the integrator module 1102. The integrator module 1102 can output a commutation angle α to the signal generator 1104, which can generate a plurality of (e.g., four) output signals w, to the drive unit 1106. Since there are two types of piezo elements (e.g., shears and clamps) and two sets of piezo actuators in the illustrated embodiment (see e.g., FIGS. 7A-7D), the signal generator can output four signal or voltage functions $u_i$ to move the drive unit in the selected manner. In one representative embodiment, the clamp elements can be energized with the clamp element drive signal while the shear elements are kept stationary. By measuring the position of the mover element $x_m$ for a constant drive signal, the influence of the tilted clamp elements on the position of the mover element $x_m$ can be determined. As the open-loop measurement proceeds, the displacement of the mover element can be determined.

In the particular open-loop measurement referred to above, the clamp elements of the actuators can be energized using a drive signal while the shear elements of the actuators remain stationary at 0 V. By measuring the position of the mover element for a constant drive frequency, the influence of the tilted clamp elements on the position of the mover element can be determined.

Figure 12A:
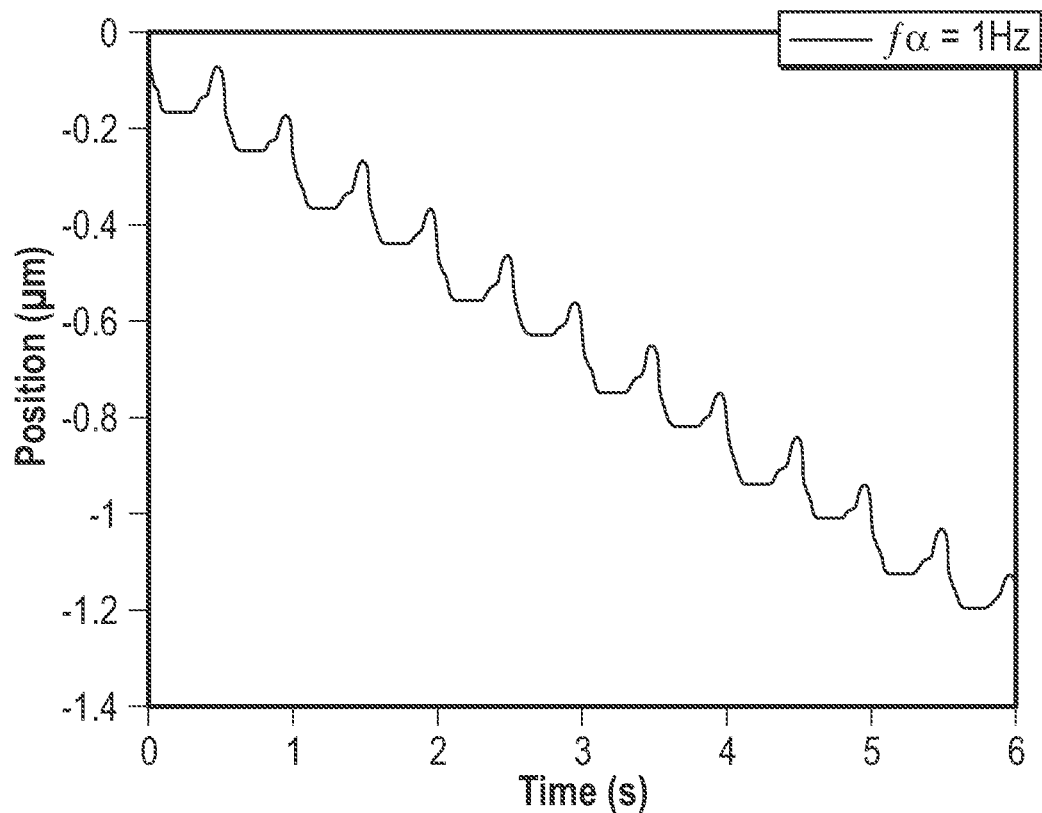
FIG. 12A is a graph of the position of a clamp element over time for a drive frequency of 1 Hz.
Figure 12B:
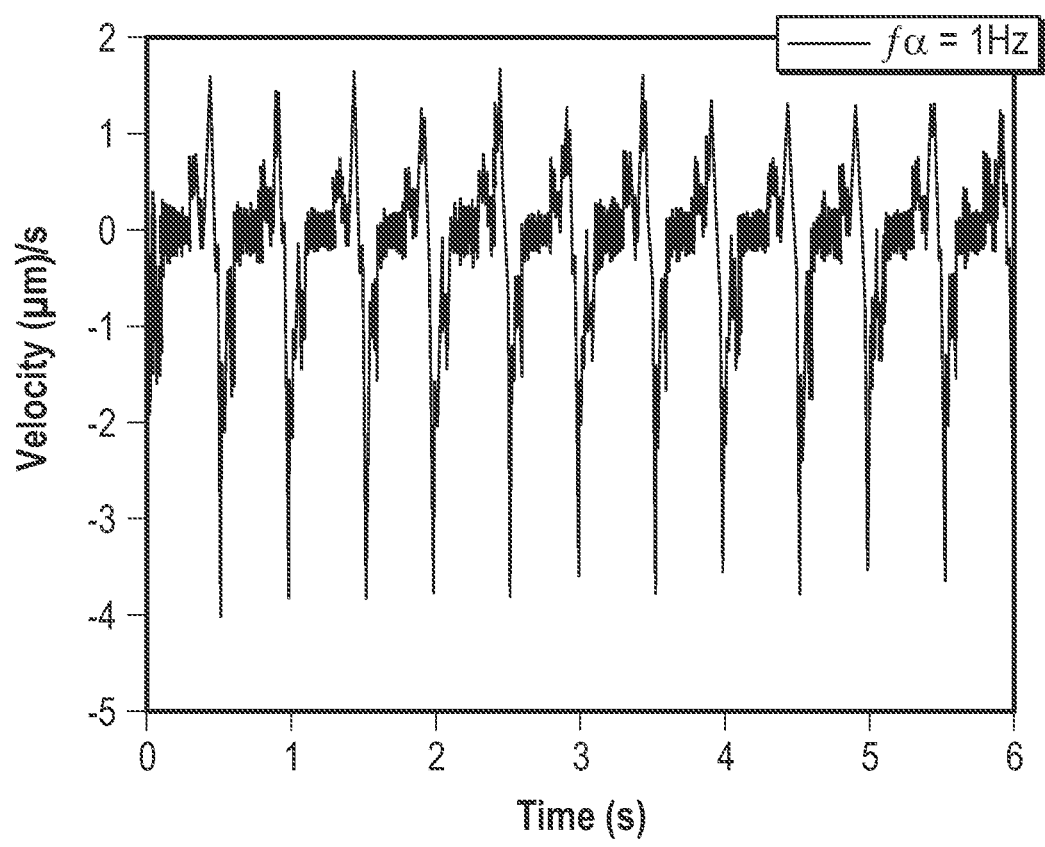
FIG. 12B is a graph of the velocity of a clamp element over time for a drive frequency of 1 Hz.

FIGS. 12A-12B show exemplary position and velocity measurements determined using the open-loop measurement FIG. 12A shows an exemplary position evaluation using a constant drive frequency $f_\alpha$ of 1 Hz, and FIG. 12B shows an exemplary velocity evaluation using a constant drive frequency $f_\alpha$ of 1 Hz. As can be seen in FIGS. 12A and 12B, the velocity signal is repetitive, and therefore, the disturbances in the position signal are repetitive.

Example 10

Figure 13A:
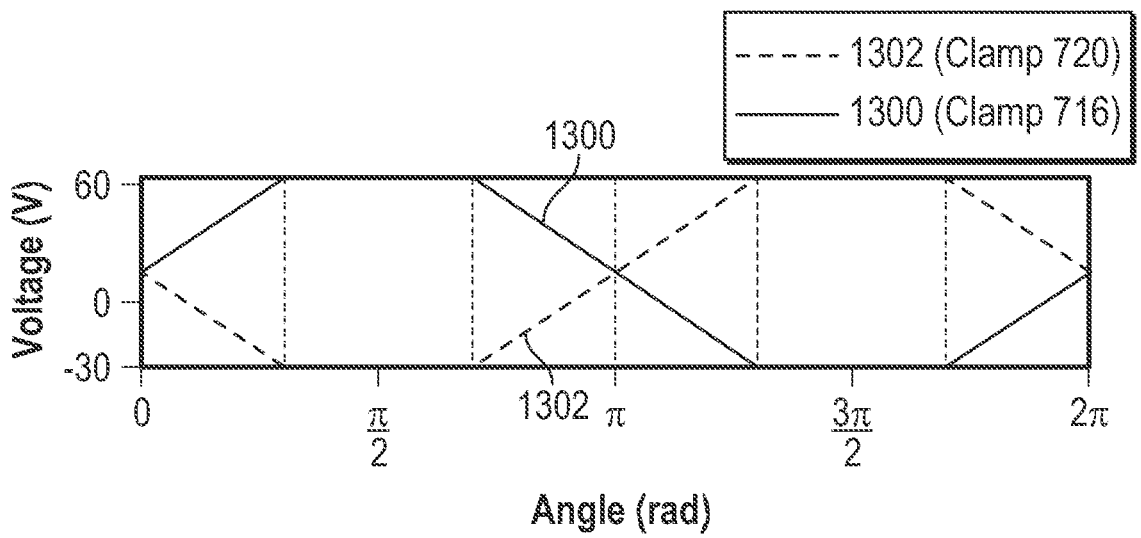
FIG. 13A is a graph of a representative signal for one or more clamp elements of a drive unit.
Figure 13B:
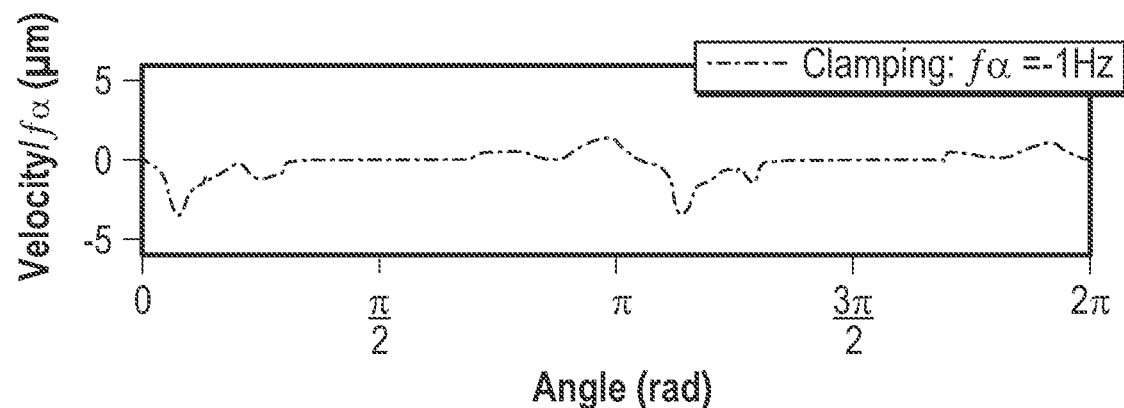
FIG. 13B is a representative graph of velocity as a function of time for a clamping measurement.
Figure 13C:
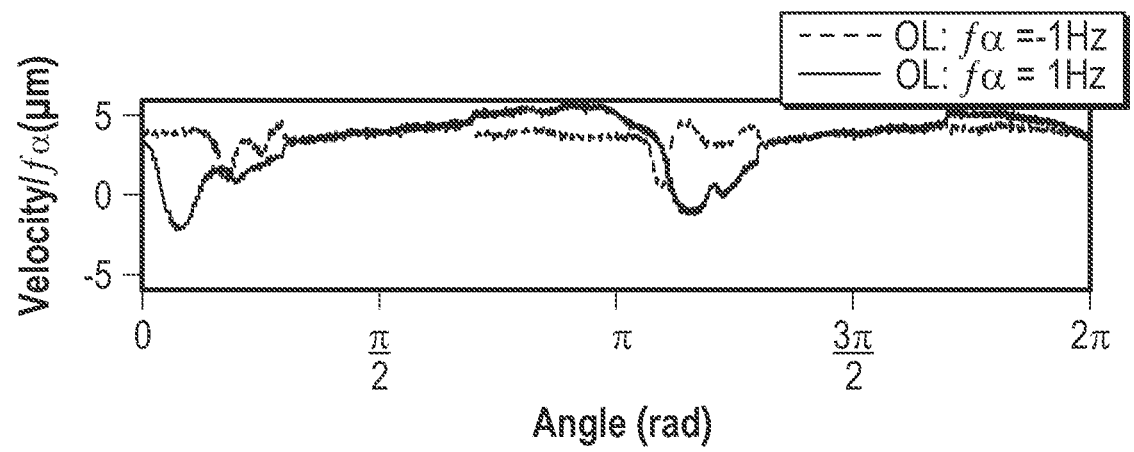
FIG. 13C is a representative graph of velocity as a function of time with an open-loop control.

In certain embodiments, the disturbances in velocity, and therefore position, can be related to the drive signal applied to the clamp elements and to the directional dependence of the open-loop response, as shown in FIGS. 13A-13C. For the moments in the drive cycle where the voltage applied to the clamp elements of the actuators is constant, the velocity can be zero. FIG. 13A shows the typical drive signal applied to the clamp elements of the actuators. FIG. 13B shows the normalized velocity evolution for a clamping measurement having a drive frequency of 1 Hz. FIG. 13C shows the normalized velocity evolution for a clamping element driven by the open-loop control system 1100 with $f_\alpha$ {−1, 1} Hz. Referring to FIG. 13B, it can be seen that for the movements in the drive cycle where the voltage applied to the clamp elements is constant, the velocity for the clamping measurement is zero. When the clamp elements begin to contract (e.g., at α=0.71π rad and α=1.71π rad), the velocity of the clamp elements increases to an approximately constant rate or level. As shown in FIG. 13C, the velocity of the clamping element with $f_\alpha$=1 Hz increases and the velocity of the clamping element with $f_\alpha$=−1 Hz decreases.

A similar disturbance occurs prior to the constant clamping phase (e.g., at α=0.28π rad and α=1.28π rad). Just prior to and just after the constant clamping phase only one clamp element is in contact with the mover (e.g., the clamp element of the first set of actuators or the clamp element of the second set of actuators). Accordingly, the increase and decrease in velocity can be the result of a tilted clamp element.

Figure 14:
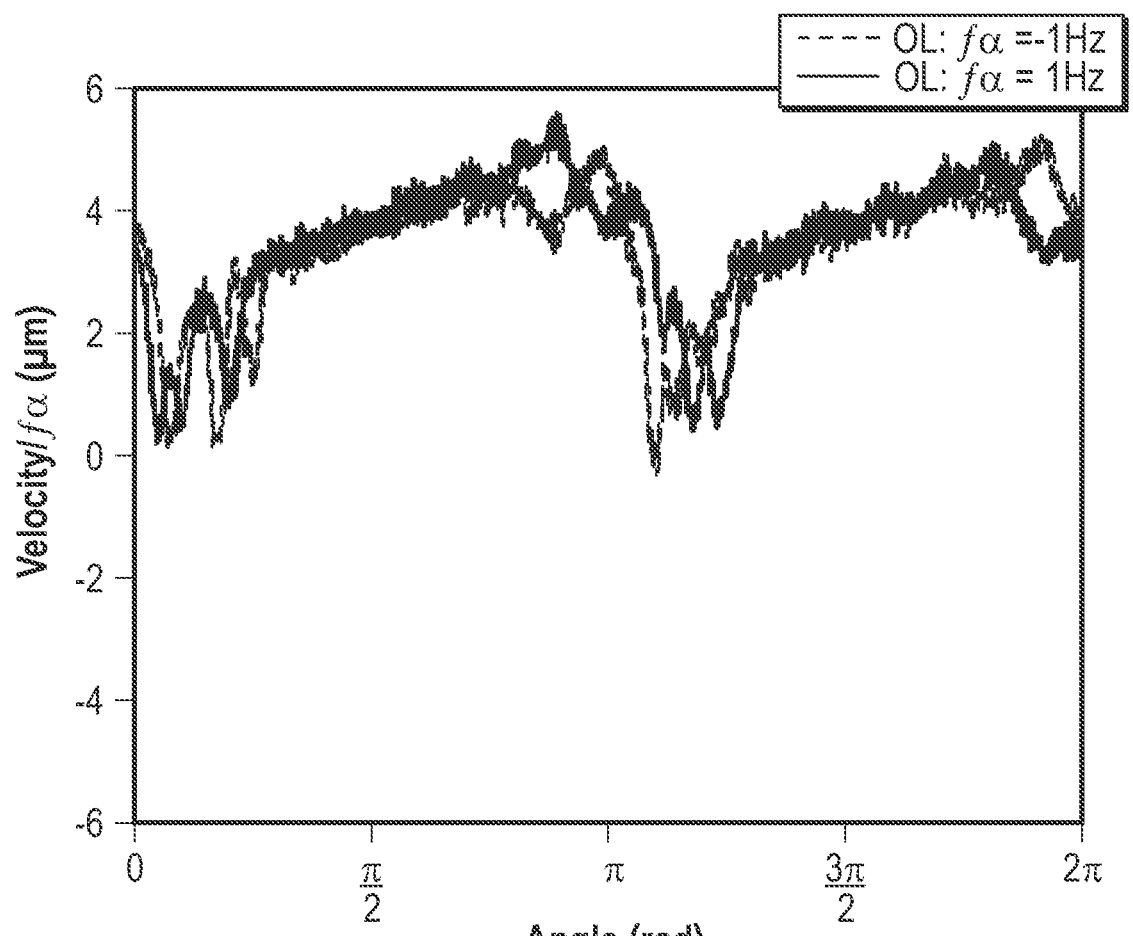
FIG. 14 is a representative graph of a velocity signal for 1 Hz and −1 Hz drive signals corrected with a clamping velocity signal.

The disturbances caused by one or more tilted clamp elements of the actuators can be at least partially offset or mitigated by actuating the shear elements to compensate for the tilt or misalignment of the clamp elements. More particularly, angled clamp elements can be at least partially compensated for by modifying the waveform of the drive signal(s) of the shear elements to provide a modified drive signal (e.g., a signal comprising an initial shear signal in combination with a compensation signal) to the shear elements of the actuators. An exemplary compensation signal can be produced by superposition of the velocity as a result of the clamping measurement and the open-loop measurement. FIG. 14 shows the normalized open-loop velocity signal for 1 Hz and −1 Hz corrected with the clamping velocity signal based on a superposition of shear and clamp velocity. It can be seen in FIG. 14 that that the minima at α∈{0.1π, 1.15π} rad are reduced to approximately 0 m/s. Thus, in certain embodiments, with the tilt compensation algorithms described herein, at least the negative velocities can be avoided.

Example 11

Misalignment, displacement, and/or tilt of the clamp element with respect to the mover element can be at least partially compensated for by modifying the motion of the shear elements. The displacement trajectory of the shear elements can be determined based at least in part on the observed displacement of the mover element when acted upon by the clamping elements. In certain embodiments, the shear elements can have a stroke length of approximately $3.0 \times 10^{-6}$ m when a voltage signal with an amplitude of 250 V is applied. Accordingly, the voltage required to create a certain shear displacement can be approximated by the model given below in Equations 1 and 2. The inverse shear constant $\hat{G}^{-1}$ relates the applied voltage to the shear displacement of the shear piezo elements.

$$\hat{G}^{-1} = 1.6 \cdot 10^8 \left[\frac{V}{m}\right] \quad \text{Equation 1}$$

$$u = -\hat{G}^{-1}(x_m)[V] \quad \text{Equation 2}$$

In equations 2 and 3, $\hat{G}^{-1}$ is the inverse shear constant [V/m], u is the applied voltage [V], and $x_m$ is the position of the mover element [m].

Ideally, the displacement of the mover element when clamped by a clamping element should be 0 m. Thus, in certain embodiments, the shear compensation signal or waveform can be generated using an iterative learning control (ILC) scheme and an inverse shear model, such as shown by Equation 3.

$$u_{j+1} = u_j - \hat{G}^{-1}(x_m) \quad \text{Equation 3}$$

In Equation 3, $u_{j+1}$ is the adjusted compensation signal [V], $u_j$ is the initial compensation signal [V], $\hat{G}^{-1}$ is the inverse shear constant [V/m], and $x_m$ is the displacement of the mover [m].

Example 12

Figure 15A:
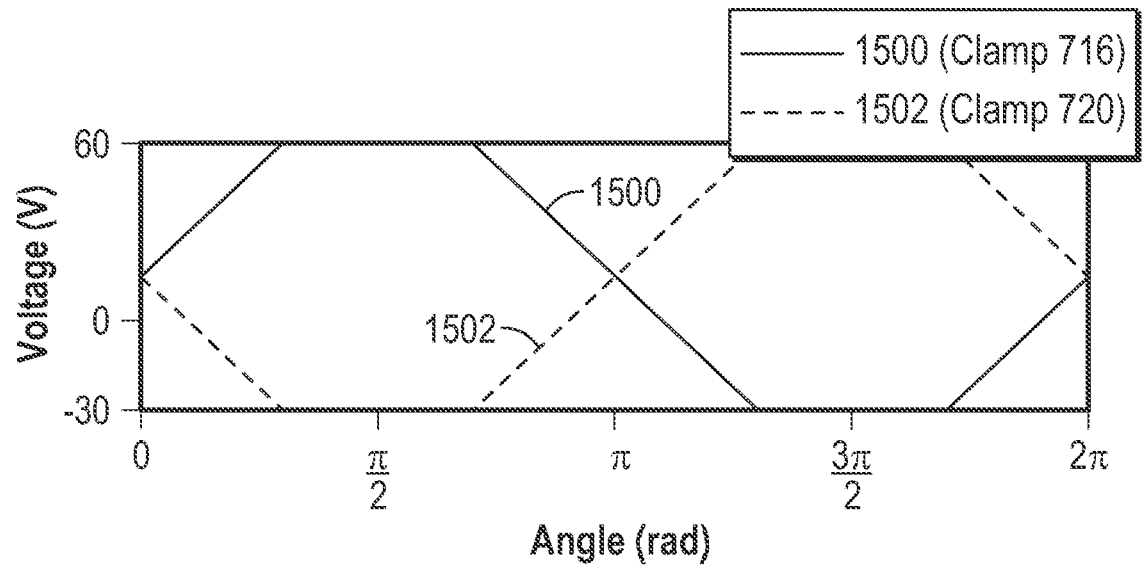
FIG. 15A is a graph of a representative drive signal for one or more clamp elements of a drive unit.
Figure 15B:
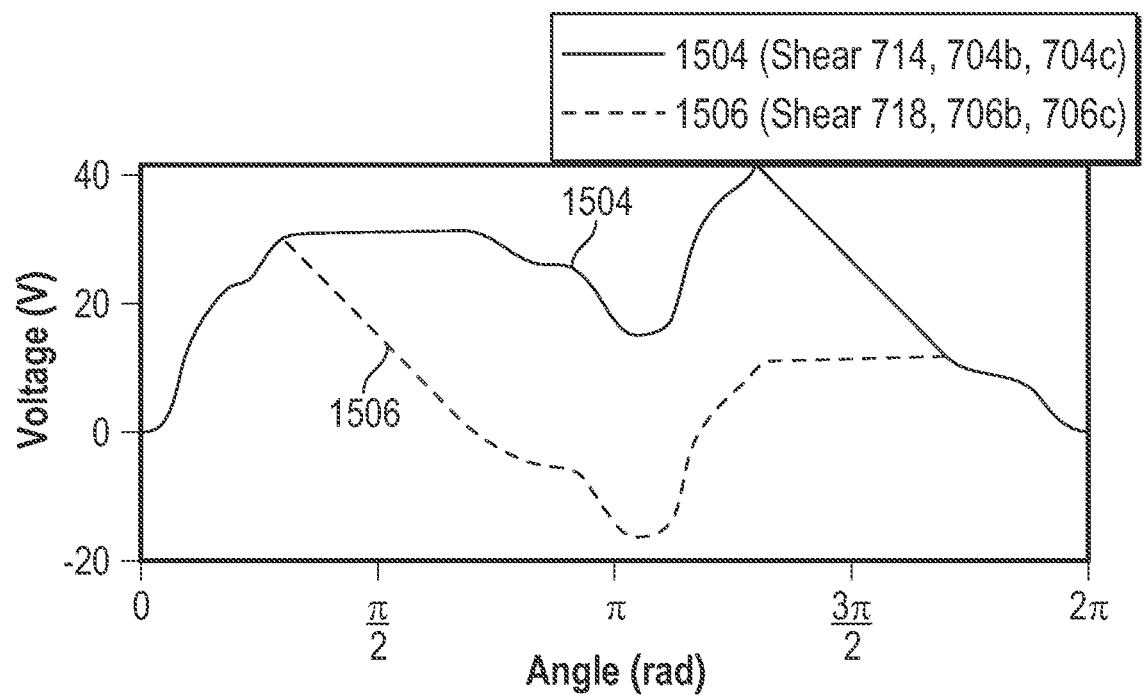
FIG. 15B is a graph of a representative compensated drive signal for one or more shear elements of a drive unit.

FIGS. 15A and 15B show initial voltage waveforms for the clamping elements and the shear elements that can be used with an ILC system to tune the shear element drive signal. FIG. 15A shows the typical drive signal applied to the clamp elements of the actuators during operation of the drive unit in order to move the clamp elements in a first direction (e.g., toward or away from the mover element), and FIG. 15B shows an initial drive signal, referred to herein as a compensation signal or waveform, to be applied to the shear elements of the actuators in order to move the shear elements in a second direction (e.g., opposite from the direction of movement of the mover element). In certain embodiments, the signal illustrated in FIG. 15B can be obtained based at least in part on the path or position of the mover element during a clamping operation in which the clamp elements are actuated with the signals shown in FIG. 15A. In other words, the initial voltage signal for the shear elements can be based at least in part on the path of the mover element during a clamping operation in which there is no compensation for misalignment. For example, the initial voltage waveform for driving the shear elements can be obtained by multiplying the position of the mover $x_m$ with the inverse shear constant $\tilde{G}^{-1}$, and subtracting the resultant quantity from the initial, unmodified shear element voltage signal according to Equation 3 above. The clamps can then be actuated again, and the shear elements can be driven with the waveform resulting from Equation 3. The shear elements can move in the second direction (e.g., opposite the direction of movement of the mover element) to compensate at least in part for misalignment between the clamp element and the mover element. The displacement, position, or path of the mover element can be determined (e.g., using the position encoder), and a difference between the measured displacement and the target displacement can be measured for an entire drive cycle (e.g., from $\alpha=0$ to $\alpha=2\pi$). This difference can be referred to as the error. The total sum of the error can be compared with a target displacement or path (e.g., 0 m, or no movement). If the displacement is above a preselected threshold (e.g., 1 μm, 100 nm, 10 nm, etc.), a second shear element voltage signal can then be determined based at least in part on the difference between the measured displacement of the mover element and the target displacement. In certain embodiments, the retracting motion of the shear elements can be oriented such that this group is not in contact with the mover element during clamping, meaning that any changes in the position of the mover element can be caused by misalignment of the clamp elements.

Figure 16:
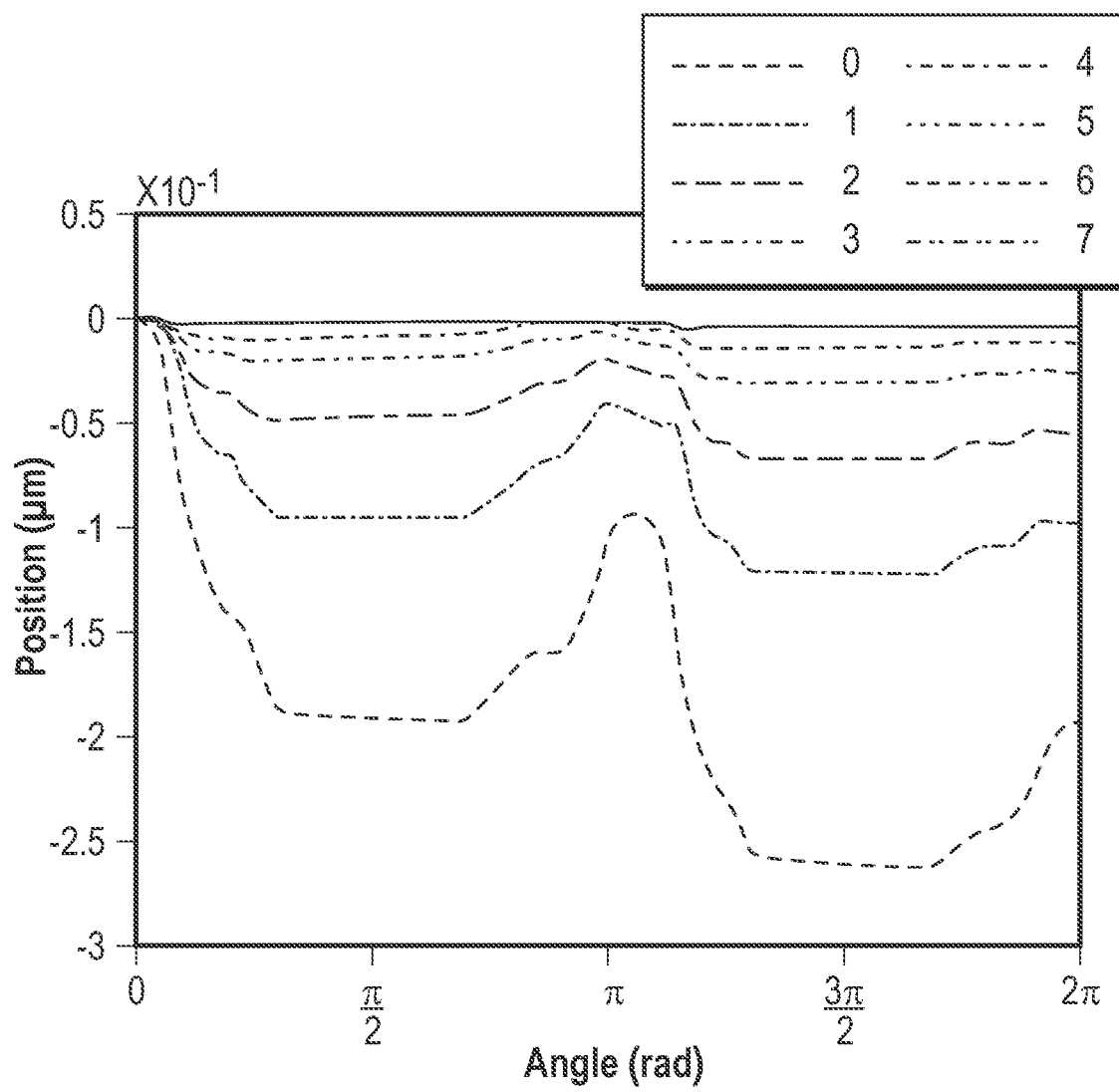
FIG. 16 is a graph showing position of a mover element as a function of commutation angle, where the drive signal has been modified by successive executions of an iterative learning control scheme to compensate for misalignment of the clamp element.

The drive signal for the shear elements (e.g., the voltage applied to the shear elements) can be modified iteratively by repeating the process above in order to reduce movement of the mover element during clamping by the clamping elements. The process can be repeated until the displacement of the mover element converges to the target displacement, or near to the target displacement. FIG. 16 shows the evolution of the drive signal over 8 iterative trials of the ILC scheme. For each trial the drive signal of the shear elements is modified in order to reduce the change in position of the mover element. In certain embodiments, it is possible to reduce displacement of the mover element by a factor of 60 or more as compared to operation of the driving unit without compensating for clamp misalignment. The shear element waveform that results in zero displacement, near zero displacement, or a preselected displacement of the mover element is referred to herein as the compensation waveform or compensation drive signal.

Example 13

Figure 17A:
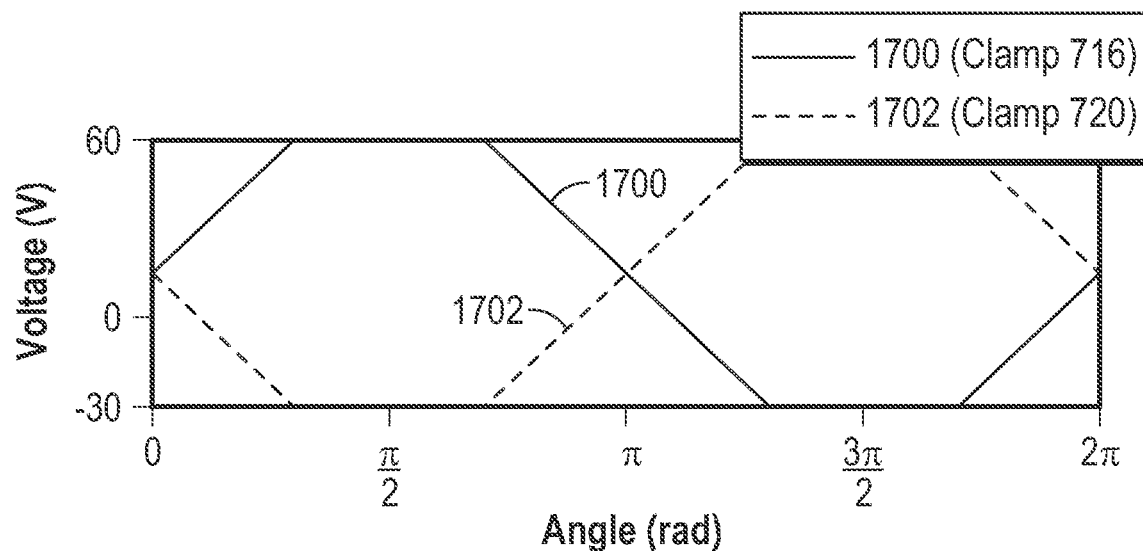
FIG. 17A is a graph of a representative drive signal for one or more clamp elements of a drive unit.
Figure 17B:
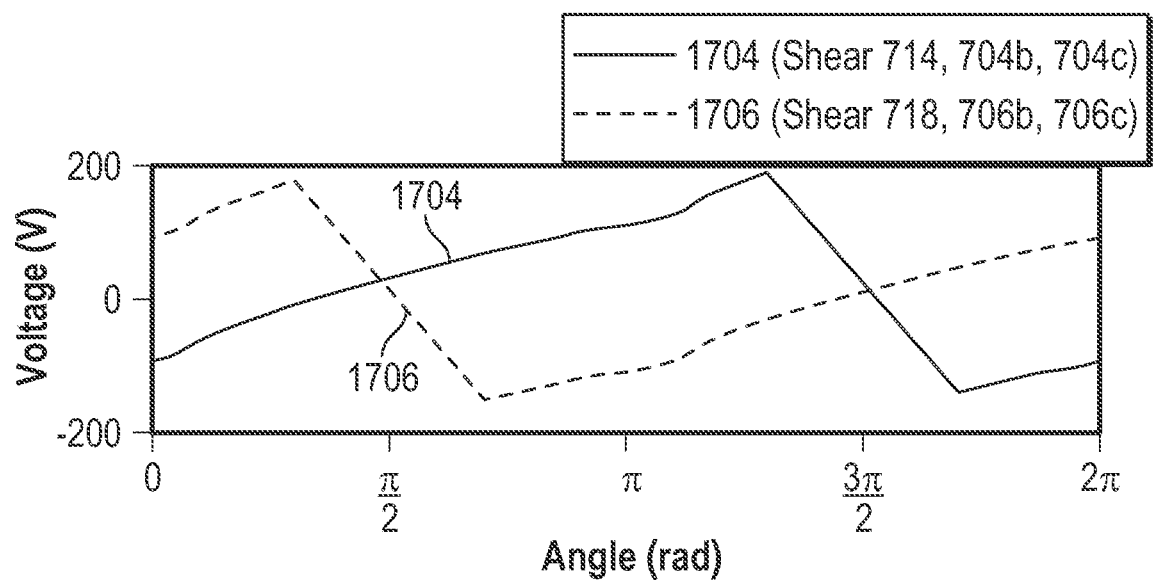
FIG. 17B is a graph of a representative compensated drive signal for one or more shear elements of a drive unit.

To apply tilt compensation during operation, a compensation drive signal, such as the compensation drive signal associated with FIG. 16 can be combined with the initial or unmodified shear element drive signal (see e.g., FIG. 8B). In some particular embodiments, due to practical limitations of the system, the maximum voltage to the shear elements can not exceed 250 V, so the amplitude of the initial waveform is reduced to 150 V. The resulting drive signals are shown in FIGS. 17A-17B. FIG. 17A shows the drive signal applied to the clamp elements, and FIG. 17B shows the modified or compensated shear element drive signal resulting from combining the compensation waveform with the initial shear drive signal. The resulting modified drive signal shown in FIG. 17B is configured to move the mover element to a target position (or by a selected distance per cycle) while mitigating movement of the mover element caused by clamp element misalignment.

Example 14

Figure 18A:
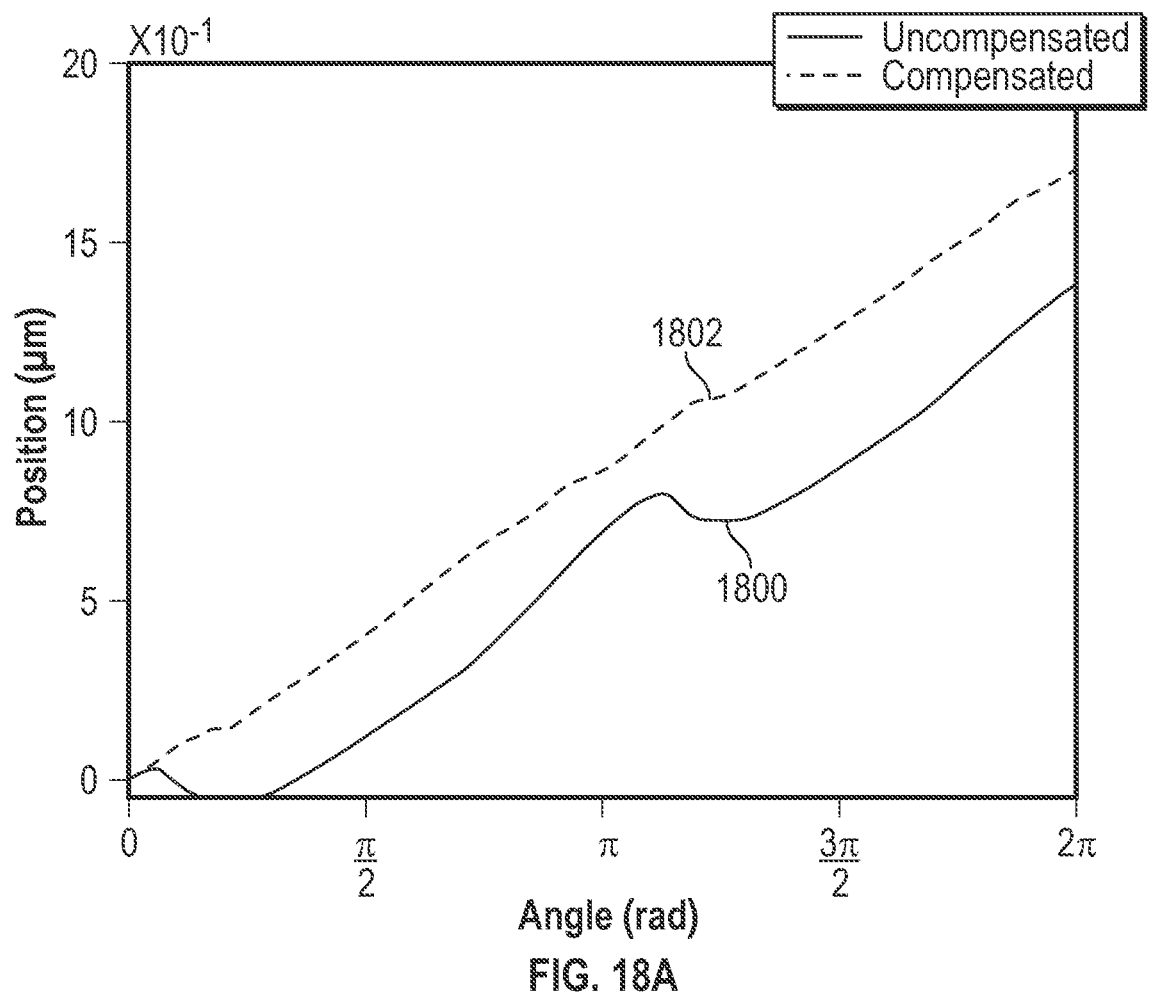
FIG. 18A is a graph showing the position of a mover element as a function of commutation angle for compensated and uncompensated drive signals.
Figure 18B:
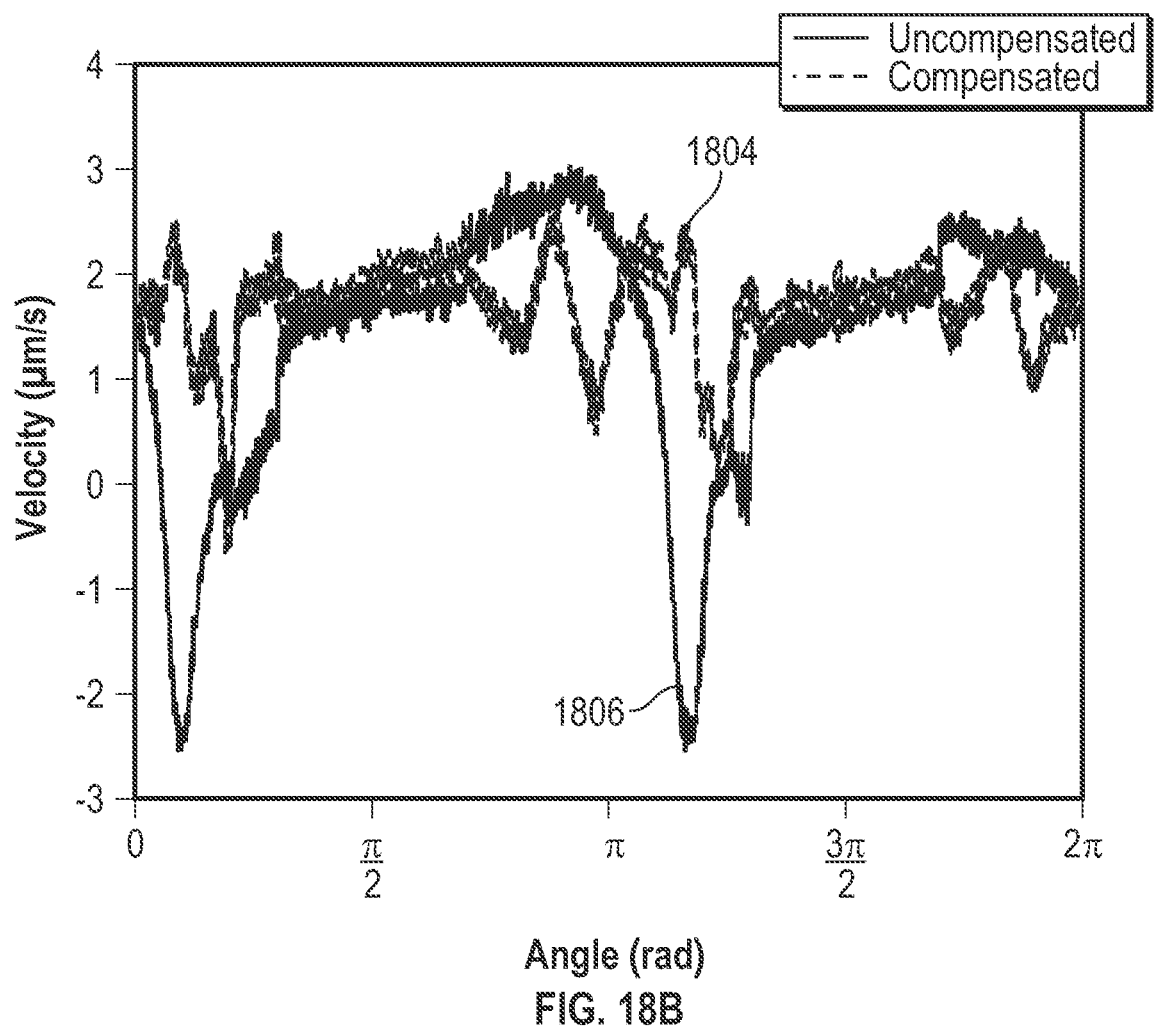
FIG. 18B is a graph showing the velocity of a mover element as a function of commutation angle for compensated and uncompensated drive signals.

FIG. 18A shows the uncompensated and compensated position evolution for a drive unit. The frequency of the drive signals can be 1 Hz. The uncompensated drive signal can be similar to the drive signals shown in FIGS. 8A and 8B, and the compensated drive signal can be similar to the drive signals shown in FIGS. 17A and 17B. The compensated position evolution 1802 is smoother and has fewer perturbations than the uncompensated position evolution 1800. FIG. 18B shows the uncompensated and compensated velocity over one drive signal cycle. The compensated velocity 1804 has no negative velocities, and is smoother and has shallower changes than the uncompensated velocity 1806. With tilt compensation, the minima in velocity evolution can be reduced to $\dot{x}m \approx 0$ m/s. In some embodiments, the same compensation signal can be applied to open-loop measurements with a different drive frequency.

Example 15

Figure 19:
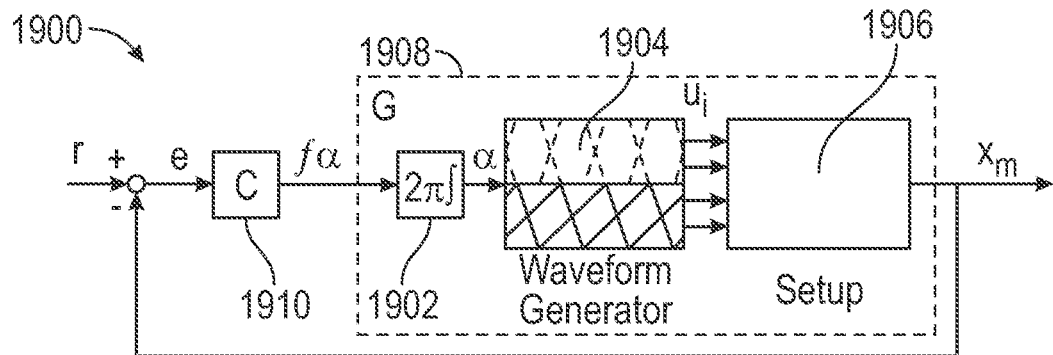
FIG. 19 is a schematic block diagram of a representative closed-loop iterative learning-based control system.

FIG. 19 illustrates an exemplary control system 1900 for closed-loop processing used to implement the processes described herein. The control system 1900 can comprise an integrator tool or module 1902 and a signal generator module 1904. The drive unit is represented at block 1906. The blocks 1902, 1904, and 1906 are grouped together inside a block 1908 representative of the physical system G (e.g., a carrier element, a drive unit, and/or a position encoder, etc.). In the illustrated embodiment, a summing junction sums a preselected threshold value r (e.g., between 10 nm and 100 nm) and $x_m$ (the displacement of the mover element) resulting in an error value e. The error value can be calculated using:

$$e = r - x_m$$

The error value can then but inputted into a controller 1910. The controller 1910 can generate a driving frequency $f_\alpha$, which can be inputted into the integrator module 1902. The integrator module 1902 can output a commutation angle $\alpha$ to the signal generator 1904, which can generate a plurality of (e.g., four) output voltage signals $u_i$ to the drive unit 1906, resulting in a positional change $x_m$. In certain embodiments, the output signal to the shear elements generated by the waveform generator 1904 can be a compensated drive signal based at least in part on predetermined motion of the mover element during clamping.

Example 16

Figure 20:
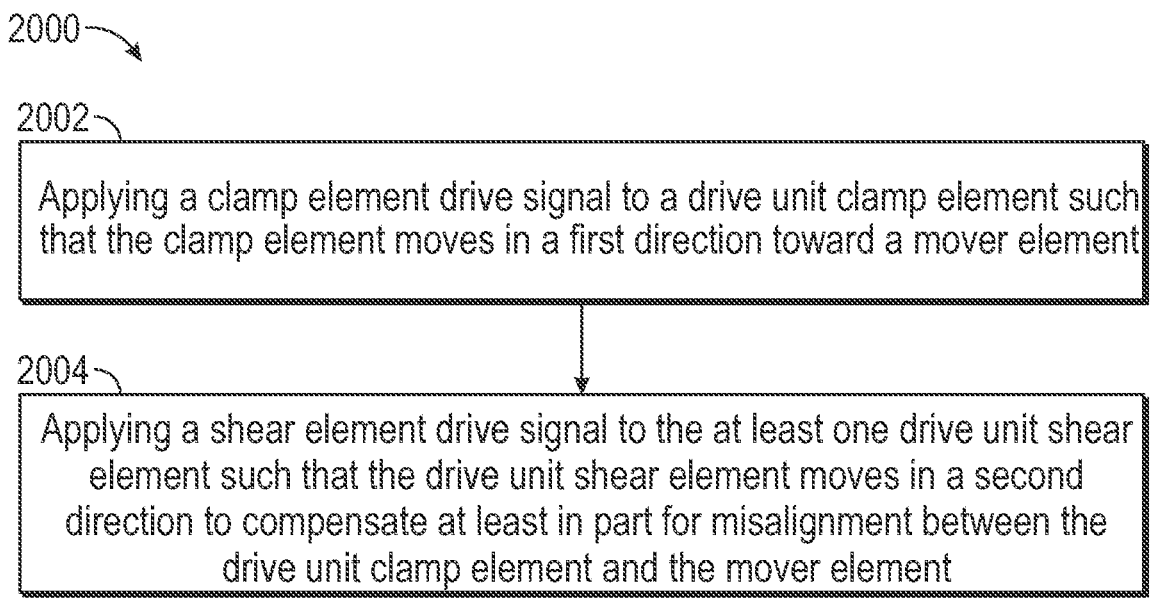
FIG. 20 is a process flow diagram of a representative method for positioning a mover element using a drive unit.

With reference to FIG. 20, a representative method 2000 for positioning a mover element of a positioning system using a drive unit comprises applying a first drive signal to a clamp element of a drive unit such that the clamp element moves in a first direction toward the mover element at 2002. At 2004, a second drive signal can be applied to at least one shear element of the drive unit such that the shear element moves in a second direction to compensate for misalignment between the clamp element and the mover element.

Example 17

Figure 21:
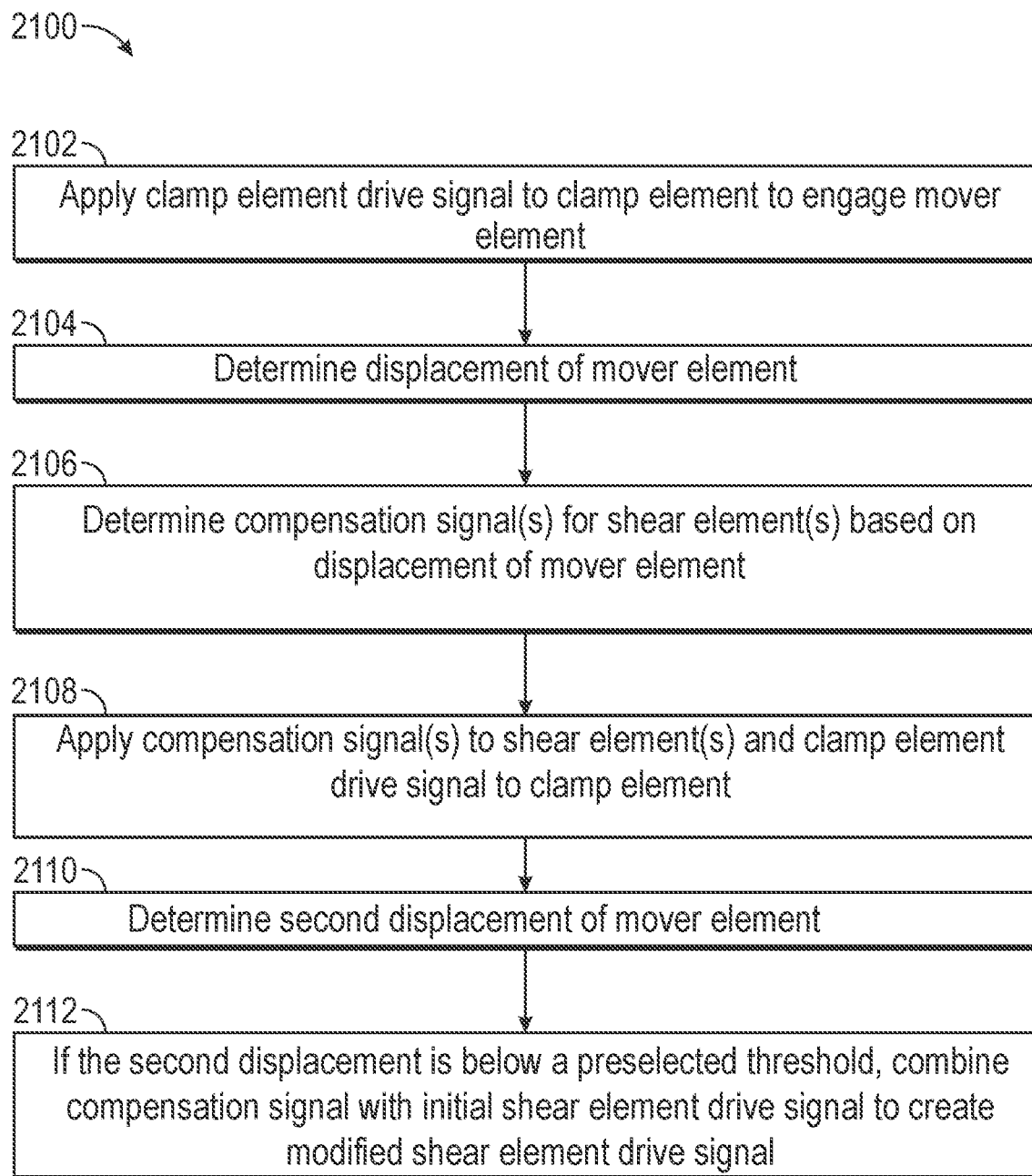
FIG. 21 is a process flow diagram of a representative method for determining a compensation signal for a drive unit.

With reference to FIG. 21, a representative method 2100 for generating a compensated drive signal for a drive unit comprises applying a clamp element drive signal to a clamp element of a drive unit, the clamp element configured to engage a mover element at 2102. At 2104, a displacement of the mover element is determined. At 2106, a compensation signal to be applied to one or more shear elements of the drive unit is determined, based at least in part on the displacement of the mover element. At 2108, the compensation signal is applied to the one or more shear elements and the clamp element drive signal is applied to the clamp element. At 2110, a second displacement of the mover element is determined. At 2112, if the second displacement is below a preselected threshold (e.g., 10 nm to 100 nm) the compensation signal is combined with an initial shear element drive signal to create a modified or compensated shear element drive signal.

Example 18

Figure 22:
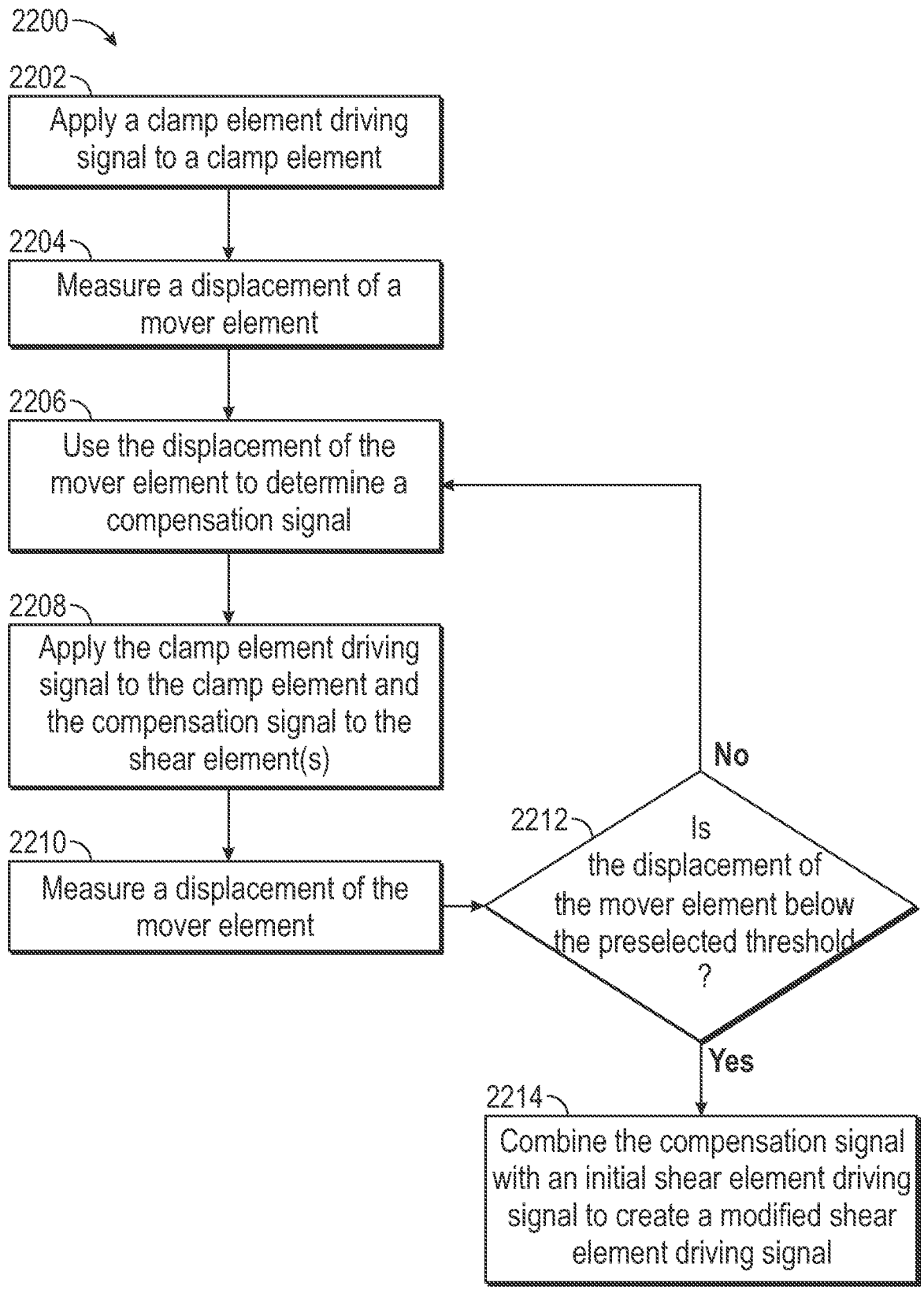
FIG. 22 is a process flow diagram of a representative method for determining a compensation signal for a drive unit.

With reference to FIG. 22, a representative method 2200 for determining a modified shear element drive signal comprises applying a clamp element drive signal to a clamp element at 2202. At 2204, a displacement of the mover element can be measured (e.g., using a position encoder). At 2206, the displacement can be used to determine a compensation signal. At 2208, the clamp element drive signal can be applied to the clamp element and the compensation signal can be applied to one or more shear elements. At 2210, the displacement of the mover element can be measured again. At 2212, if the displacement of the mover element is below a preselected threshold (e.g., if the displacement is less than a value between 10 nm and 100 nm), the compensation signal can be combined with an initial shear element drive signal to create a modified shear element drive signal at 2214. At 2216, the modified shear element drive signal can be applied to the one or more shear elements and the clamp element drive signal can be applied to the clamp element. Referring again to 2212, if the displacement is not below the preselected threshold (e.g., if the displacement is greater than a value between 10 nm to 100 nm), then the displacement of the mover element can be used to determine an additional compensation signal at 2206. Acts 2206 through 2212 can be repeated until the displacement of the mover element is below the preselected threshold.

Example 19

Figure 23:
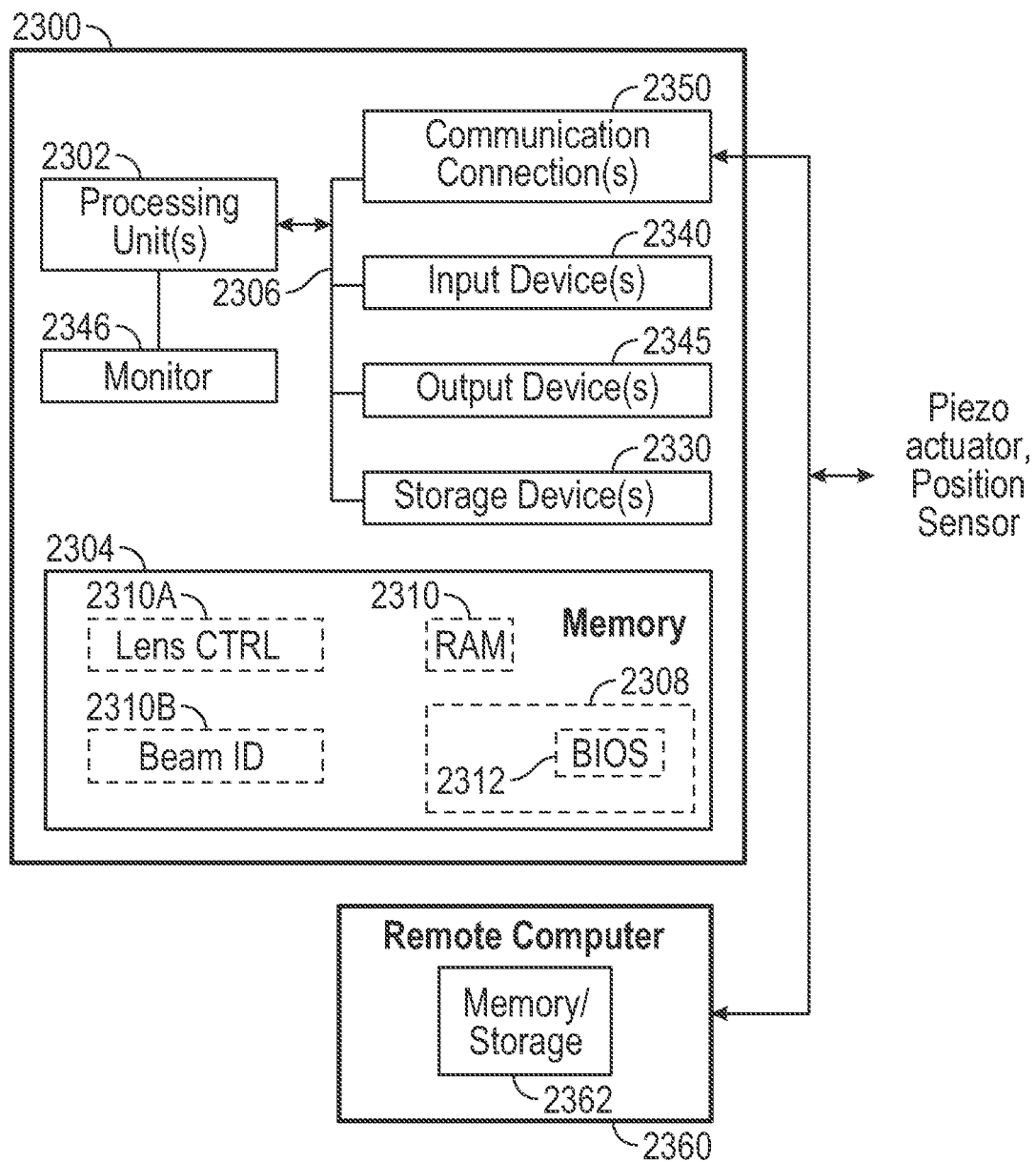
FIG. 23 illustrates a representative computer control system for use in implementing the disclosed methods and apparatus.

FIG. 23 and the following discussion are intended to provide a brief, general description of an exemplary computing environment in which the disclosed technology may be implemented. For example, controller 252 can be configured similarly to the computing environment described below. Moreover, the disclosed technology may be implemented with other computer system configurations, including hand held devices, digital signal processors (DSPs), multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 23, an exemplary system for implementing the disclosed technology includes a general-purpose controller in the form of an exemplary conventional PC 2300, including one or more processing units 2302, a system memory 2304, and a system bus 2306 that couples various system components including the system memory 2304 to the one or more processing units 2302. The system bus 2306 may be any of several types of bus structures including a memory bus or memory controller, a peripheral bus, and a local bus using any of a variety of bus architectures. The exemplary system memory 2304 includes read only memory (ROM) 2308 and random-access memory (RAM) 2310. A basic input/output system (BIOS) 2312, containing the basic routines that help with the transfer of information between elements within the PC 2300, is stored in ROM 2308. In the example of FIG. 23, data and processor-executable instructions for controlling motion of the positioning system, imaging, processing, and other operational modes of an SEM and a FIB are stored in a memory 2310A, and data and processor-executable instructions for identifying and quantifying beam components are stored in memory 2310B.

The exemplary PC 2300 further includes one or more storage devices 2330 such as a hard disk drive for reading from and writing to a hard disk, a magnetic disk drive for reading from or writing to a removable magnetic disk, and an optical disk drive. Such storage devices can be connected to the system bus 2306 by a hard disk drive interface, a magnetic disk drive interface, and an optical drive interface, respectively. The drives and their associated computer readable media provide nonvolatile storage of computer-readable instructions, data structures, program modules, and other data for the PC 2300. Other types of computer-readable media which can store data that is accessible by a PC, such as magnetic cassettes, flash memory cards, digital video disks.

A number of program modules may be stored in the storage devices 2330 including an operating system, one or more application programs, other program modules, and program data. A user may enter commands and information into the PC 2300 through one or more input devices 2340 such as a keyboard and a pointing device such as a mouse. A monitor 2346 or other type of display device is also connected to the system bus 2306 via an interface, such as a video adapter.

The PC 2300 may operate in a networked environment using logical connections to one or more remote computers, such as a remote computer 2360. In some examples, one or more network or communication connections 2350 are included. The remote computer 2360 may be another PC, a server, a router, a network PC, or a peer device or other common network node, and typically includes many or all of the elements described above relative to the PC 2300, although only a memory storage device 2362 has been illustrated in FIG. 23. The personal computer 2300 and/or the remote computer 2360 can be connected to a logical a local area network (LAN) and a wide area network (WAN).

Example 20

Figure 24:
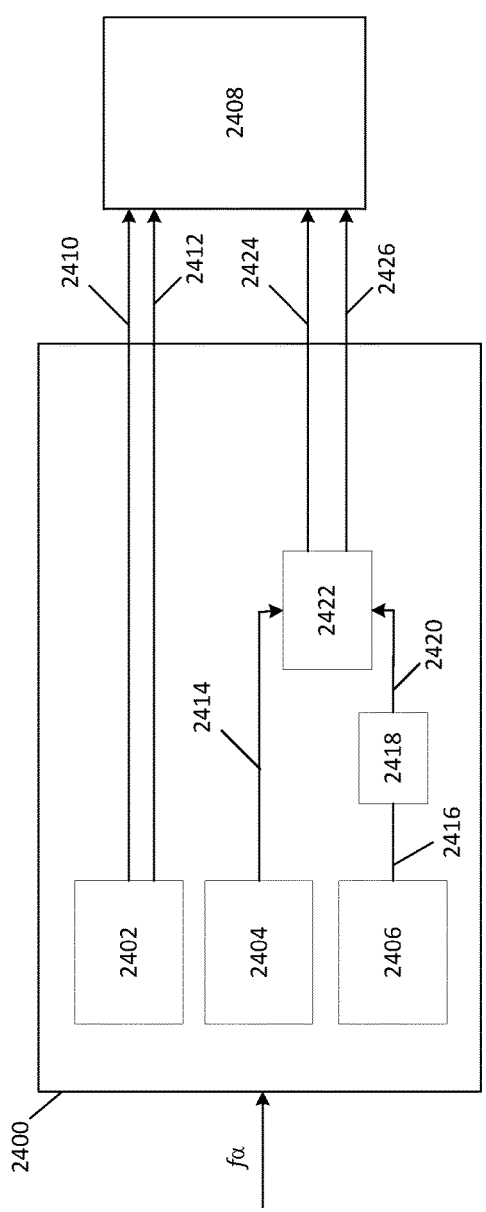
FIG. 24 illustrates a representative control system for use in implementing the disclosed methods and apparatus.

FIG. 24 shows a representative embodiment of a control system 2400 for implementing the previously-described processes. The control system can comprise a clamp signal generator 2402, a shear signal generator 2404, and a lookup table (LUT) 2406.

The clamp signal generator can be configured to produce one or more clamp element drive signal(s) to be applied to one or more clamp elements of the drive unit 2408. For example, the clamp signal generator 2402 can produce a first clamp element drive signal 2410 that can drive a first clamp element (e.g., element 716 of FIGS. 7A-7D) and a second clamp element drive signal 2412 that can drive a second clamp element (e.g., clamp element 720 of FIGS. 7A-7D). In some embodiments, the clamp signal generator can also comprise a clamp LUT. The clamp LUT can receive the commutation angle α as input and can produce the clamp drive signal(s) (e.g., voltages) as outputs. In some embodiments, the first and second clamp element drive signals 2410, 2412 can be converted from a digital signal to an analog signal using a digital-to-analog converter (DAC).

The shear signal generator can be configured to produce one or more initial shear element drive signal(s) 2414. The LUT 2406 can comprise an array of compensation or error-correction signals 2416. The LUT can be precalculated and stored in static program storage, calculated as part of the control system's initialization phase, or stored in hardware in application-specific platforms. During use, the control system 2400 can select one or more compensation signal(s) 2416 from the LUT based on system requirements. The compensation signal(s) 2416 can be converted from a digital signal to an analog signal using a digital-to-analog converter (DAC) 2418. The converted signal(s) 2420 can be combined with the initial shear element signal(s) 2414 at summation junction 2422 to produce one or more modified shear element drive signals. For example, in the illustrated embodiment, there are two modified shear element drive signals 2424 and 2426. The first shear element drive signal 2424 can drive a first set of shear elements (e.g., elements 704b, 704c, and 714 of FIGS. 7A-7D) and the second shear element drive signal 2426 can drive a second set of shear elements (e.g., elements 706b, 706c, and 718 of FIGS. 7A-7D).

In other embodiments, the compensation signal 2416 and the initial shear element drive signal(s) 2141 can be combined at summation junction 2422 as digital signals and the modified shear element drive signals 2424 and 2426 can be converted to analog signals using a DAC.

The clamp element drive signal(s) and the modified shear element drive signal(s) can be applied to the drive unit 2408 to produce movement of the drive unit. The signals, e.g., the clamp element drive signal(s), the initial shear element drive signal(s), the compensation signal(s), and the modified shear element drive signal(s), can function independently of the frequency $f_\alpha$ applied to the control system 2400.

Example 21

Figure 25:
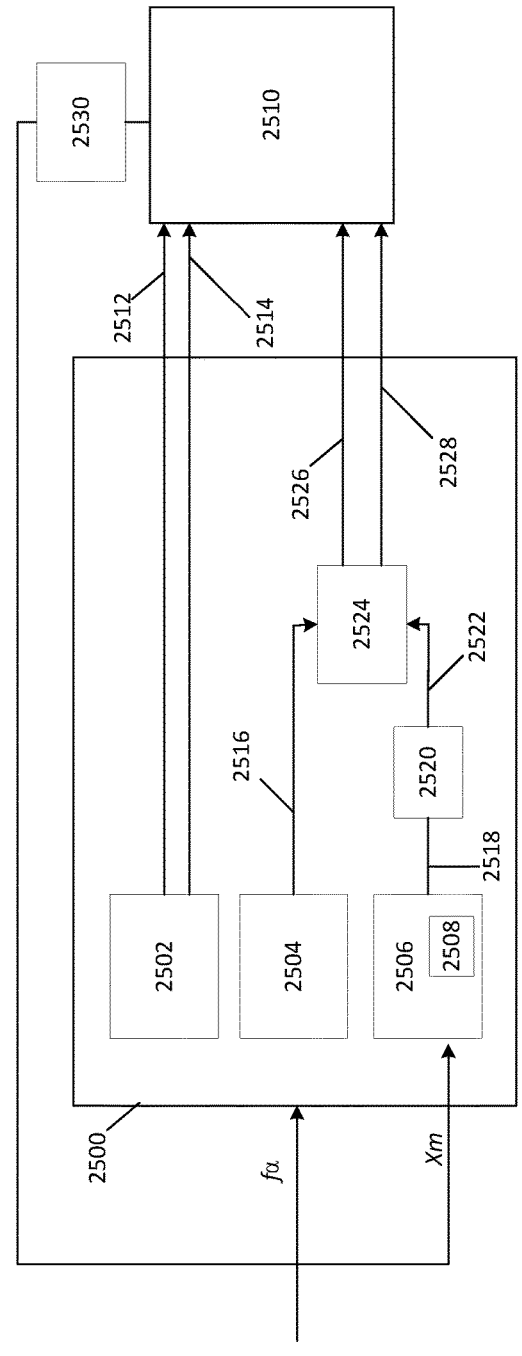
FIG. 25 illustrates a representative control system for use in implementing the disclosed methods and apparatus.

FIG. 25 shows another representative embodiment of a control system 2500 for implementing the previously-described processes. The control system 2500 can comprise a clamp signal generator 2502, a shear signal generator 2504, and a processor 2506 comprising a memory unit 2508.

The clamp signal generator can be configured to produce one or more clamp element drive signal(s) to be applied to one or more clamp elements of the drive unit 2510. For example, the clamp signal generator 2502 can produce a first clamp element drive signal 2512 that can drive a first clamp element (e.g., element 716 of FIGS. 7A-7D) and a second clamp element drive signal 2514 that can drive a second clamp element (e.g., clamp element 720 of FIGS. 7A-7D). In some embodiments, the clamp signal generator can also comprise a clamp LUT. The clamp LUT can receive the commutation angle α as input and can produce the clamp drive signal(s) (e.g., voltages) as outputs. In some embodiments, the first and second clamp element drive signals 2512, 2514 can be converted from a digital signal to an analog signal using a digital-to-analog converter (DAC).

The shear signal generator can be configured to produce one or more initial shear element drive signal(s) 2516. The processor 2506 can be configured to produce one or more error-correction or compensation signal(s) 2518. The compensation signal 2518 can be converted from a digital signal to an analog signal using a digital-to-analog converter (DAC) 2520. The converted signal(s) 2522 can be combined with the initial shear element signal(s) 2516 at a summation junction 2524 to produce one or more modified shear element drive signals. For example, in the illustrated embodiment, there are two modified shear element drive signals 2526 and 2528. The first shear element drive signal 2424 can drive a first set of shear elements (e.g., elements 704b, 704c, and 714 of FIGS. 7A-7D) and the second shear element drive signal 2426 can drive a second set of shear elements (e.g., elements 706b, 706c, and 718 of FIGS. 7A-7D).

The clamp element drive signal(s) and the modified shear element drive signal(s) can be applied to the drive unit 2510 to produce movement (e.g., displacement) of a mover element relative to the drive unit 2510. The displacement of the mover element $x_m$ can be measured using a position encoder 2530 (similar to position encoders 248 and 250 described above). The processor 2506 can use the displacement $x_m$ to calculate a compensation signal 2518 and/or to select a precalculated compensation signal from the memory 2508. For example, the processor 2506 can calculate a compensation signal based on a product of the displacement $x_m$ and the inverse shear constant. The signals, e.g., the clamp element drive signal(s), the initial shear element drive signal(s), the compensation signal(s), and the modified shear element drive signal(s), can function independently of the frequency $f_\alpha$ applied to the control system 2500.

Having described and illustrated the principles of the disclosure with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples.

GENERAL CONSIDERATIONS

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

All features described herein are independent of one another and, except where structurally impossible, can be used in combination with any other feature described herein.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Unless otherwise indicated, all numbers expressing material quantities, angles, pressures, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under test conditions/methods familiar to those of ordinary skill in the art. When directly and explicitly distinguishing embodiments from discussed prior art, the embodiment numbers are not approximates unless the word "about" is recited. Furthermore, not all alternatives recited herein are equivalents.

In view of the many possible embodiments to which the principles of the disclosure may be applied, it should be recognized that the illustrated embodiments are only preferred examples and should not be taken as limiting the scope of the disclosure. Rather, the scope of the disclosure is at least as broad as the following claims. We therefore claim all that comes within the scope and spirit of these claims.

We claim:

1. A method, comprising:
    applying a clamp element drive signal to a drive unit clamp element to engage a mover element;
    determining a first displacement of the mover element;
    determining a first compensation signal to be applied to one or more drive unit shear elements based at least in part on the first displacement;
    applying the first compensation signal to the one or more drive unit shear elements and the clamp element drive signal to the drive unit clamp element;
    determining a second displacement of the mover element in response to the first compensation signal and the clamp element drive signal; and
    comparing the second displacement to a preselected threshold;
    for a second displacement less than the preselected threshold, combining the first compensation signal with an initial shear element drive signal to produce a modified shear element drive signal; and
    for a second displacement greater than the preselected threshold, determining a second compensation signal to be applied to the one or more drive unit shear elements.

2. The method of claim 1, further comprising applying the clamp element drive signal to the drive unit clamp element while applying the modified shear element drive signal to the one or more drive unit shear elements.

3. The method of claim 1, wherein determining the compensation signal comprises multiplying the displacement of the mover element by an inverse shear constant of the one or more shear elements.

4. The method of claim 1, further comprising:
    applying the first compensation signal and the second compensation signal to the one or more drive unit shear elements and the clamp element drive signal to the drive unit clamp element;
    determining a third displacement of the mover element;
    comparing the third displacement to the preselected threshold; and
    for a third displacement less than the preselected threshold, combining the second compensation signal with an initial shear element drive signal to produce a modified shear element drive signal; and
    for a third displacement greater than the preselected threshold, determining a third compensation signal to be applied to the one or more drive unit shear elements.

5. The method of claim 4, wherein the compensation signal is a first compensation signal, and wherein determining the second compensation signal comprises multiplying the second displacement of the mover element by an inverse shear constant of the one or more shear elements and subtracting the result from the first compensation signal.

6. The method of claim 1, wherein determining the displacement of the mover element comprises measuring the displacement of the mover element with a position encoder.

7. The method of claim 1, wherein the displacement of the mover element is caused at least in part by misalignment between the drive unit clamp element and the mover element.

8. The method of claim 1, wherein the drive unit clamp element and the one or more drive unit shear elements together comprise a drive unit, and wherein the drive unit is a walking piezo drive unit.

9. The method of claim 8, wherein the drive unit clamp element is positioned adjacent a first surface of the mover element, and the one or more drive unit shear elements are positioned adjacent a second surface of the mover element opposite the first surface.

10. The method of claim 9, wherein the drive unit clamp element comprises a clamp piezo element and a shear piezo element.

11. A method, comprising:
    applying a clamp element drive signal to a clamp element to engage a mover element, the clamp element and a shear element together comprising a drive unit wherein a contact surface of the drive unit contacts a surface of the mover element at a non-perpendicular contact angle causing the mover element to move by a first displacement;

determining the first displacement of the mover element;

determining a first compensation signal to be applied the shear element based at least in part on the first displacement;

applying an initial shear element drive signal to the shear element and the clamp element drive signal to the clamp element to move the mover element a second distance;

determining a second displacement of the mover element in response to the first compensation signal and the clamp element drive signal, the second displacement due at least in part to the non-perpendicular contact angle; and comparing the second displacement to a preselected threshold;

for a second displacement less than the preselected threshold, combining the first compensation signal with the initial shear element drive signal to produce a modified shear element drive signal; and for a second displacement greater than the preselected threshold, determining a second compensation signal to be applied to the one or more drive unit shear elements.

12. The method of claim 11, wherein the preselected threshold is between 10 nm to 100 nm.

13. The method of claim 11, further comprising repeating the steps of determining the second displacement of the mover element in response to the first compensation signal and the clamp element drive signal, the second displacement due at least in part to the non-perpendicular contact angle, and comparing the second displacement to a preselected threshold until the second displacement is below than the preselected threshold.

14. The method of claim 11, wherein the compensation signal is generated using an iterative learning control (ILC) scheme.

15. The method of claim 11, wherein the drive unit is a first drive unit and wherein the method further comprises applying the clamp element drive signal to a second drive unit positioned adjacent to an opposing surface of the mover element.

16. The method of claim 11, wherein the modified shear element drive signal compensates at least in part for the second displacement by causing movement of the drive unit shear element and the mover element in a direction opposite the direction of movement of the mover element caused by contact with the drive unit.

17. The method of claim 11, wherein the clamp elements are longitudinal piezo elements.

18. The method of claim 11, wherein the shear elements are shear piezo elements.

19. The method of claim 11, wherein the drive unit is a walking piezo drive unit comprising first, second, and third actuators, the first actuator being positioned adjacent a first surface of the mover element and the second and third actuators being positioned adjacent a second surface of the mover element opposite the first surface.

20. The method of claim 19, wherein the first actuator comprises a clamp piezo element and a shear piezo element, and wherein the second and third actuators each comprise a shear piezo element.

* * * * *